(12) United States Patent
Tachibana et al.

(10) Patent No.: US 12,463,064 B2
(45) Date of Patent: Nov. 4, 2025

(54) SUBSTRATE PROCESSING METHOD AND SUBSTRATE PROCESSING APPARATUS

(71) Applicant: TOKYO ELECTRON LIMITED, Tokyo (JP)

(72) Inventors: Kouzou Tachibana, Koshi (JP); Katsuhiro Morikawa, Koshi (JP); Kouichi Mizunaga, Koshi (JP); Masami Akimoto, Koshi (JP); Kousuke Negishi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 573 days.

(21) Appl. No.: 17/510,234

(22) Filed: Oct. 25, 2021

(65) Prior Publication Data
US 2022/0130691 A1    Apr. 28, 2022

(30) Foreign Application Priority Data

Oct. 26, 2020   (JP) .................................. 2020-179057

(51) Int. Cl.
*H01L 21/683*  (2006.01)
*H01L 21/67*   (2006.01)

(52) U.S. Cl.
CPC .. *H01L 21/67051* (2013.01); *H01L 21/67046* (2013.01); *H01L 21/67103* (2013.01); *H01L 21/67248* (2013.01); *H01L 21/6838* (2013.01)

(58) Field of Classification Search
None
See application file for complete search history.

(56) References Cited

U.S. PATENT DOCUMENTS

2008/0200100 A1* 8/2008 Takahashi ......... H01L 21/67219
                                                            438/692
2018/0335706 A1* 11/2018 Wang ................. G03F 7/70875

FOREIGN PATENT DOCUMENTS

| CN | 102099900   | * | 6/2011  |
| JP | 10294261    | * | 11/1998 |
| JP | 2002009141 A |   | 1/2002  |

(Continued)

OTHER PUBLICATIONS

Translation of JP2010034264 by Onuma, published Feb. 12, 2010.*

(Continued)

*Primary Examiner* — Kaj K Olsen
*Assistant Examiner* — Ryan L Coleman
(74) *Attorney, Agent, or Firm* — Nath, Goldberg & Meyer; Jerald L. Meyer; Tanya E. Harkins

(57) ABSTRACT

A substrate processing method of performing liquid processing on a substrate in a substrate processing apparatus, which includes a substrate table configured to suction the substrate, a heater configured to heat the substrate table, and a processing liquid nozzle configured to supply a processing liquid to the substrate suctioned to the substrate table, includes: a suctioning process of suctioning the substrate by the substrate table when there is no temperature difference between the substrate and the substrate table or when a temperature difference between the substrate and the substrate is within a predetermined range; and after the suctioning process, a processing liquid supply process of supplying the processing liquid from the processing liquid nozzle to the substrate suctioned to the substrate table heated by the heater.

9 Claims, 21 Drawing Sheets

(56) References Cited

FOREIGN PATENT DOCUMENTS

| | | | |
|---|---|---|---|
| JP | 2005217226 | * | 8/2005 |
| JP | 3837026 A | | 8/2006 |
| JP | 2007201139 A | | 8/2007 |
| JP | 2010034264 | * | 2/2010 |
| JP | 2012-129462 A | | 7/2012 |
| JP | 2013123001 A | | 6/2013 |
| JP | 2013191802 A | | 9/2013 |
| JP | 2014-123713 A | | 7/2014 |
| JP | 2014195009 A | | 10/2014 |
| JP | 2015076558 A | | 4/2015 |
| JP | 2017041642 A | | 2/2017 |
| JP | 2017069261 A | | 4/2017 |
| JP | 2020057763 A | | 4/2020 |
| KR | 20090064022 | * | 6/2009 |
| KR | 20160133171 | * | 11/2016 |
| KR | 10-2020-0035877 A | | 4/2020 |
| WO | 2020/067246 A1 | | 4/2020 |

OTHER PUBLICATIONS

Translation of KR20160133171 by Lee, published Nov. 22, 2016.*
Translation of JP10294261 by Akune, published Nov. 4, 1998.*
Translation of CN102099900 by Tamura, published Jun. 15, 2011.*
Translation of JP2005217226 by Kishio, published Aug. 11, 2005.*
Translation of KR20090064022 by Jeong, published Jun. 18, 2009.*

* cited by examiner

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2020-179057, filed on Oct. 26, 2020, the entire contents of which are incorporated herein by reference.

TECHNICAL FIELD

The present disclosure relates to a substrate processing method and a substrate processing apparatus.

BACKGROUND

In manufacturing a semiconductor device, a substrate such as a semiconductor wafer is subjected to liquid processing such as a chemical liquid cleaning process or a wet etching process by supplying a temperature-controlled and heated chemical liquid to the substrate. Patent Document 1 describes an example of a single-wafer type substrate processing apparatus that performs such liquid processing. The apparatus of Patent Document 1 includes a spin chuck configured to hold and rotate a wafer, and a non-rotating disk-shaped member (a bottom movement member) configured to be brought into contact with and detached from a bottom surface of the wafer held by the spin chuck. A heater is embedded inside the bottom movement member. A gap of about 0.5 to 3 mm, which is formed between a top surface of the bottom movement member and the bottom surface of the wafer, is filled with a chemical liquid, and the chemical liquid is heated by the heater of the non-rotating bottom movement member. By rotating the wafer at a low speed of about 30 to 50 rpm by the spin chuck, it is possible to perform chemical liquid processing on the bottom surface of the wafer by using the temperature-controlled chemical liquid while preventing the chemical liquid from stagnating in the gap.

PRIOR ART DOCUMENT

Patent Document

Patent Document 1: Japanese Patent No. 3837026

SUMMARY

According to an embodiment, there is provided a substrate processing method of performing liquid processing on a substrate in a substrate processing apparatus, which includes a substrate table configured to suction the substrate, a heater configured to heat the substrate table, and a processing liquid nozzle configured to supply a processing liquid to the substrate suctioned to the substrate table. The substrate processing method includes: a suctioning process of suctioning the substrate by the substrate table when there is no temperature difference between the substrate and the substrate table or when a temperature difference between the substrate and the substrate is within a predetermined range; and after the suctioning process, a processing liquid supply process of supplying the processing liquid from the processing liquid nozzle to the substrate suctioned to the substrate table heated by the heater.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of a substrate processing apparatus (a substrate processing system) will be described below with reference to the attached drawings.

Figure 1:
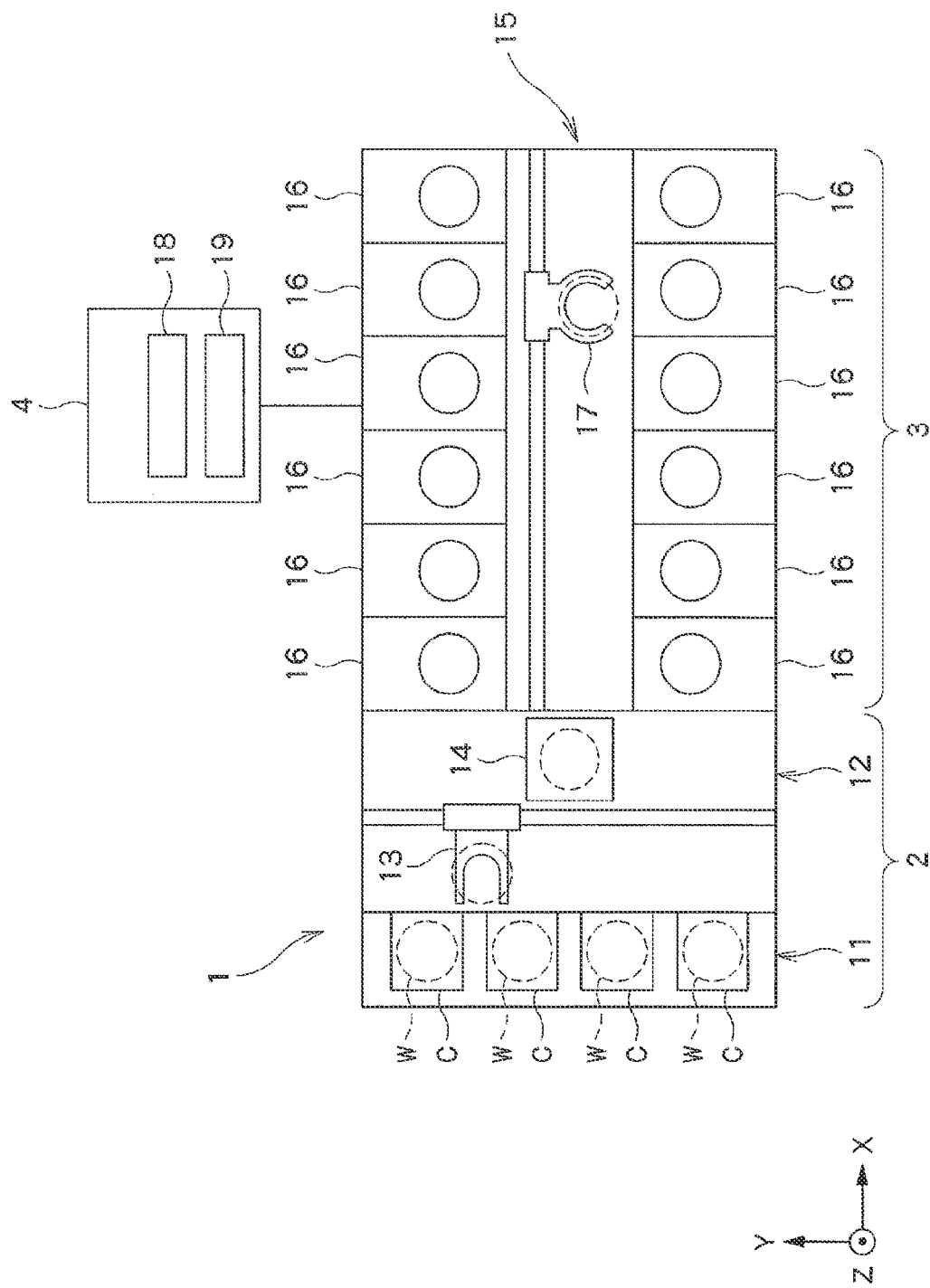
FIG. 1 is a schematic plan view illustrating the entire configuration of a substrate processing apparatus according to an embodiment.

FIG. 1 is a view illustrating a schematic configuration of a substrate processing system according to an embodiment. In the following description, in order to clarify positional relationships, an X axis, a Y axis, and a Z axis, which are orthogonal to one another, are defined, and a positive direction of the Z axis is defined as a vertically upward direction.

As illustrated in FIG. 1, a substrate processing system 1 includes a loading/unloading station 2 and a processing station 3. The loading/unloading station 2 and the processing station 3 are provided adjacent to each other.

The loading/unloading station 2 includes a carrier stage 11 and a transfer part 12. A plurality of carriers C, each of which accommodates a plurality of semiconductor wafers W (hereinafter, referred to as "wafers W") horizontally, is placed on the carrier stage 11.

The transfer part 12 is provided adjacent to the carrier stage 11 and includes therein a substrate transfer apparatus 13 and a delivery part 14. The substrate transfer apparatus 13 includes a wafer holding mechanism configured to hold the wafer W. In addition, the substrate transfer apparatus 13 can move in a horizontal direction and a vertical direction, and can rotate about a vertical axis. Thus, the wafer W can be transferred between the carrier C and the delivery part 14 by using the wafer holding mechanism.

The processing station 3 is provided adjacent to the transfer part 12. The processing station 3 includes a transfer part 15 and a plurality of processing units 16. The processing units 16 are arranged side by side on opposite sides of the transfer part 15.

The transfer part 15 includes therein a substrate transfer device 17. The substrate transfer device 17 includes a wafer holding mechanism configured to hold the wafer W. In addition, the substrate transfer device 17 can move in the horizontal direction and the vertical direction, and can rotate about the vertical axis. Thus, the wafer W can be transferred between the delivery part 14 and a processing unit 16 by using the wafer holding mechanism.

Each processing unit 16 performs predetermined substrate processing on the wafer W transferred thereto by the substrate transfer device 17.

In addition, the substrate processing system 1 includes a control device 4. The control device 4 is, for example, a computer, and includes a controller 18 and a storage 19. The storage 19 stores programs for controlling various processes executed in the substrate processing system 1. The controller 18 controls operations of the substrate processing system 1 by reading and executing the programs stored in the storage 19.

In addition, such programs may be stored in a non-transitory computer-readable storage medium and may be installed in the storage 19 of the control device 4 from the storage medium.

The non-transitory computer-readable storage medium may include, for example, a hard disk (HD), a flexible disk (FD), a compact disk (CD), a magneto-optical disk (MO), a memory card, and the like.

In the substrate-processing system 1 configured as described above, first, the substrate transfer apparatus 13 of the loading/unloading station 2 takes out the wafer W from the carrier C placed in the carrier stage 11 and places the taken-out wafer W on the delivery part 14. The wafer W placed on the delivery part 14 is taken from the delivery part 14 by the substrate transfer device 17 of the processing station 3 and loaded into the processing unit 16.

The wafer W loaded into the processing unit 16 is processed by the processing unit 16, and then is unloaded from the processing unit 16 and placed on the delivery part 14 by the substrate transfer device 17. Then, the processed wafer W placed on the delivery part 14 is returned to the carrier C in the carrier stage 11 by the substrate transfer apparatus 13.

Next, a configuration of an embodiment of the processing unit 16 will be described. The processing unit 16 is configured as a single-wafer type liquid processing unit.

Figure 2:
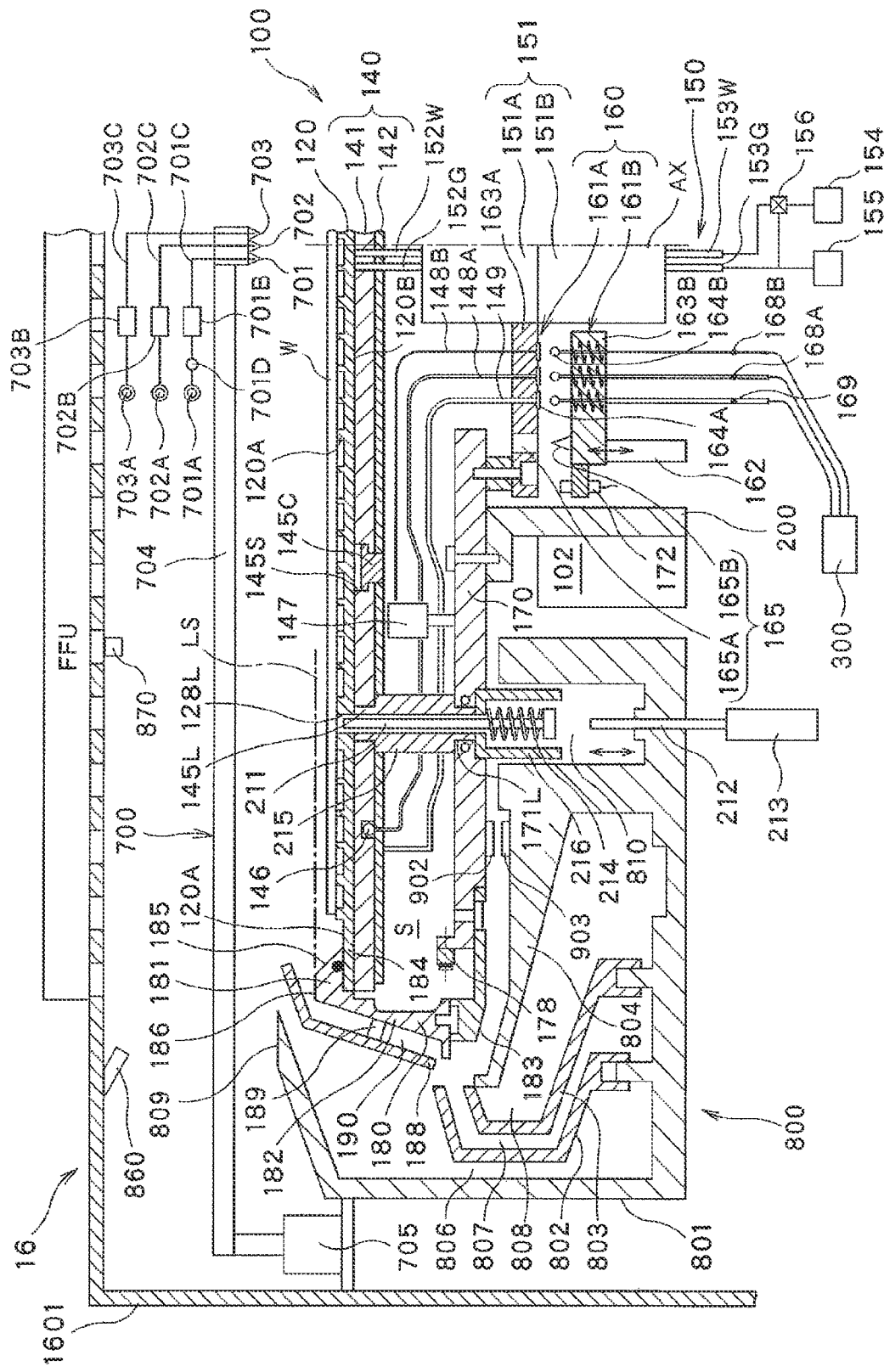
FIG. 2 is a schematic cross-sectional view illustrating an exemplary configuration of a processing unit included in the substrate-processing apparatus of FIG. 1.

As illustrated in FIG. 2, the processing unit 16 includes a rotary table (a substrate table) 100, a processing liquid supplier 700 configured to supply a processing liquid to a wafer W, and a liquid receiving cup (a processing cup) 800 configured to collect the processing liquid scattered from a rotating substrate. The rotary table 100 is capable of horizontally holding and rotating a circular substrate such as the wafer W. The components of the processing unit 16 such as the rotary table 100, the processing liquid supplier 700, and the liquid receiving cup 800 are accommodated in a housing 1601 (also referred to as a processing chamber).

Although FIG. 2 illustrates only a left-hand side half of the processing unit 16, the processing unit 16 has a substantially symmetrical configuration with respect to a rotation axis Ax thereof illustrated at a right-hand side end of FIG. 2. In order to ensure a dynamic balance of the rotary table 100 during rotation, one or more balance weights 178 may be mounted on the rotary table 100.

The rotary table 100 includes a suction plate 120, a hot plate 140, a support plate 170, a peripheral edge cover body 180, and a hollow rotary shaft 200. The suction plate 120 sucks the wafer W placed on the suction plate 120 in a horizontal posture. The hot plate 140 is a base plate for the suction plate 120 and supports and heats the suction plate 120. The support plate 170 supports the suction plate 120 and the hot plate 140.

The rotary shaft 200 extends downward from the support plate 170. The rotary table 100 rotates around the rotation axis Ax extending in the vertical direction by an electric drive part (a rotational drive mechanism) 102 disposed in the vicinity of the rotation shaft 200, thereby rotating the wafer W held thereon around the rotation axis Ax. The electric drive part 102 (details of which are not illustrated) may transmit power generated by an electric motor to the rotary shaft 200 via a power transmission mechanism (e.g., a belt and a pulley) to rotationally drive the rotary shaft 200. The electric drive part 102 may directly rotate and drive the rotary shaft 200 by an electric motor.

The suction plate 120 is a disk-shaped member having a diameter that is slightly larger than a diameter of the wafer W (depending on a configuration, the diameter of the suction plate 120 may be the same as that of the wafer W), namely, having an area that is larger or equal to an area of the wafer W. The suction plate 120 has a top surface (a front surface) 120A configured to suction a bottom surface (a surface that is not a processing target) of the wafer W, and a bottom surface (a rear surface) 120B in contact with a top surface of the hot plate 140. The suction plate 120 may be formed of a material having a high thermal conductivity such as thermally conductive ceramic (e.g., SiC). It is desirable that the thermal conductivity of the material of the suction plate 120 be 150 W/m k or more.

The hot plate 140 is a disk-shaped member having a diameter substantially equal to the diameter of the suction plate 120. The hot plate 140 has a plate main body 141 and an electric heater 142 provided in the plate main body 141. The plate main body 141 is formed of a material having a high thermal conductivity such as thermally conductive ceramic (e.g., SiC). It is desirable that the thermal conductivity of the material of the plate main body 141 be, for example, 150 W/m k or more.

Figure 3:
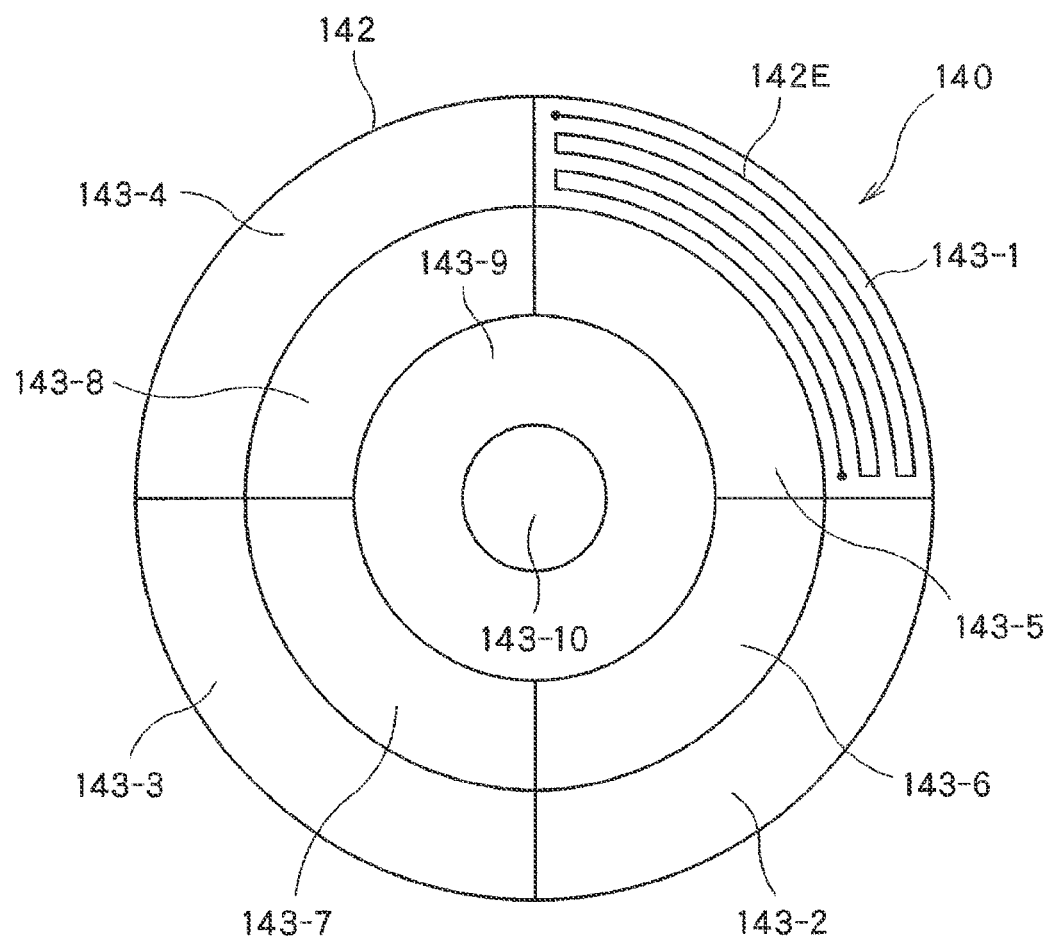
FIG. 3 is a schematic plan view illustrating an exemplary arrangement of heaters of a hot plate provided in the processing unit.

The heater 142 may be constituted with a planar heater (e.g., a polyimide heater) provided on a bottom surface (a rear surface) of the plate main body 141. It is desirable that a plurality of (e.g., ten) heating zones 143-1 to 143-10 is set in the hot plate 140, as illustrated in FIG. 3. The heater 142 includes a plurality of heater elements 142E assigned to the respective heating zones 143-1 to 143-10. Each heater element 142E is formed of a conductor that meanders and extends within each of the heating zones 143-1 to 143-10. In FIG. 3, only the heater element 142E in the heating zone 143-1 is illustrated.

The heater elements 142E may be fed with power independently of one another by a power feeder 300 to be described later. Therefore, different heating zones of the wafer W can be heated under different conditions, whereby a temperature distribution of the wafer W can be controlled.

Figure 4:
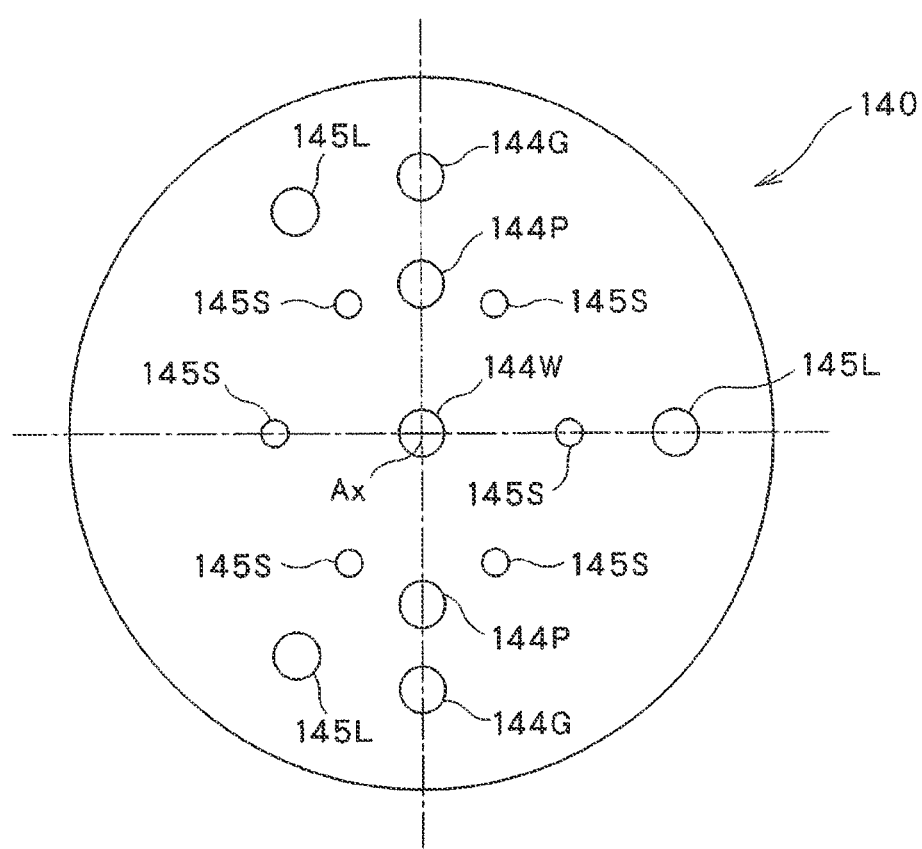
FIG. 4 is a schematic plan view illustrating an exemplary configuration of a top surface of the hot plate.

As illustrated in FIG. 4, a top surface (a front surface) of the plate main body 141 has one or more (two in the illustrated example) plate suction ports 144P, one or more (one in a central portion in the illustrated example) substrate suction ports 144W, and one or more (two in outer portions in the illustrated example) purge gas supply ports 144G. The plate suction ports 144P are used to transmit a suction force for suctioning the suction plate 120 to the hot plate 140. The substrate suction port 144W is used to transmit a suction force for suctioning the wafer W to the suction plate 120.

In addition, in the plate main body 141, a plurality of (three in the illustrated example) lift pin holes 145L, through which lift pins 211 to be described later pass, respectively, and a plurality of (six in the illustrated example) service holes 145S for accessing screws for assembling the rotary table 100 are formed. During normal operation, the service holes 145S are closed with caps 145C, respectively.

The heater elements 142E described above are arranged to avoid the plate suction ports 144P, the substrate suction port 144W, the purge gas supply ports 144G, the lift pin holes 145L, and the service holes 145S. Further, the service holes may be eliminated by connecting the plate main body 141 with the rotary shaft 200 using an electromagnet.

Figure 5:
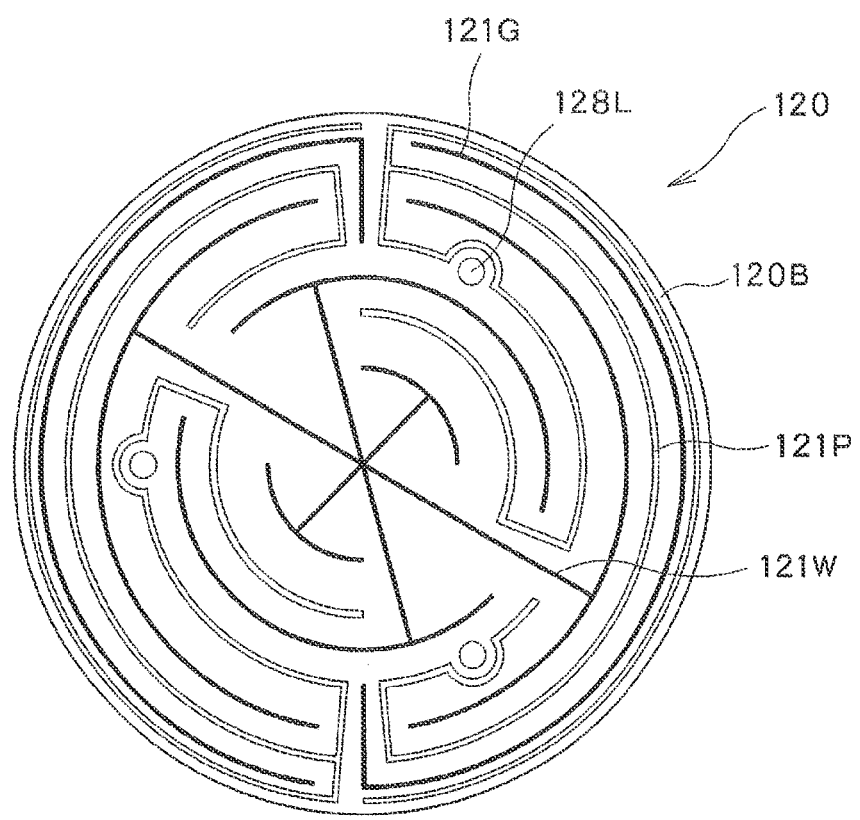
FIG. 5 is a schematic plan view illustrating an exemplary configuration of a bottom surface of a suction plate provided in the processing unit.

As illustrated in FIG. 5, in the bottom surface 120B of the suction plate 120, a plate bottom surface suction flow path groove 121P, a substrate bottom surface suction flow path groove 121W, and a bottom surface purge flow path groove 121G are formed. When the suction plate 120 is placed on the hot plate 140 with an appropriate positional relationship, at least a part of the plate bottom surface suction flow path groove 121P are in communication with the plate suction ports 144P. Similarly, at least a part of the substrate bottom surface suction flow path groove 121W is in communication with the substrate suction port 144W, and at least a part of the bottom surface purge flow path groove 121G is in communication with the purge gas supply ports 144G. The plate bottom surface suction flow path groove 121P, the substrate bottom surface suction flow path groove 122W, and the bottom surface purge flow path groove 121G are separated from one another (not in communication with one another).

Figure 10:
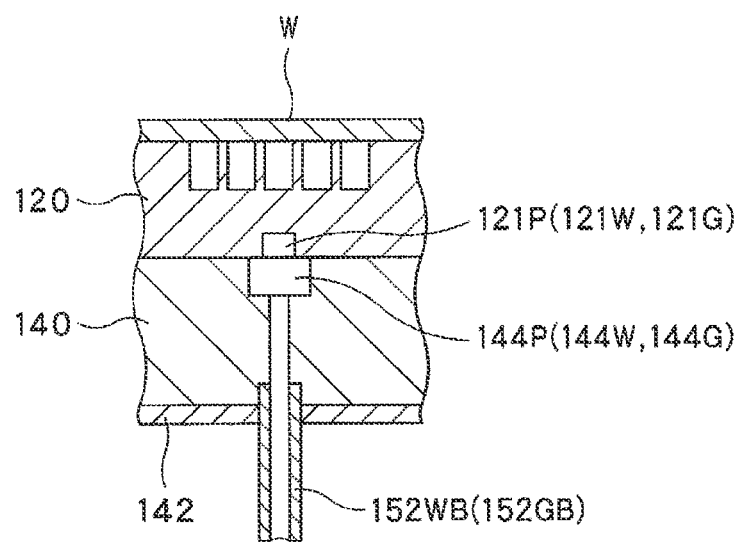
FIG. 10 is a schematic cross-sectional view of the suction plate on a cut surface different from that of FIG. 9.

FIG. 10 schematically illustrates a state in which the plate suction port 144P (or the substrate suction port 144W or the purge gas supply port 144G) in the hot plate 140 overlaps and is in communication with the flow path groove 121P (or the flow path groove 121W or 121G) in the suction plate 120.

Figure 6:
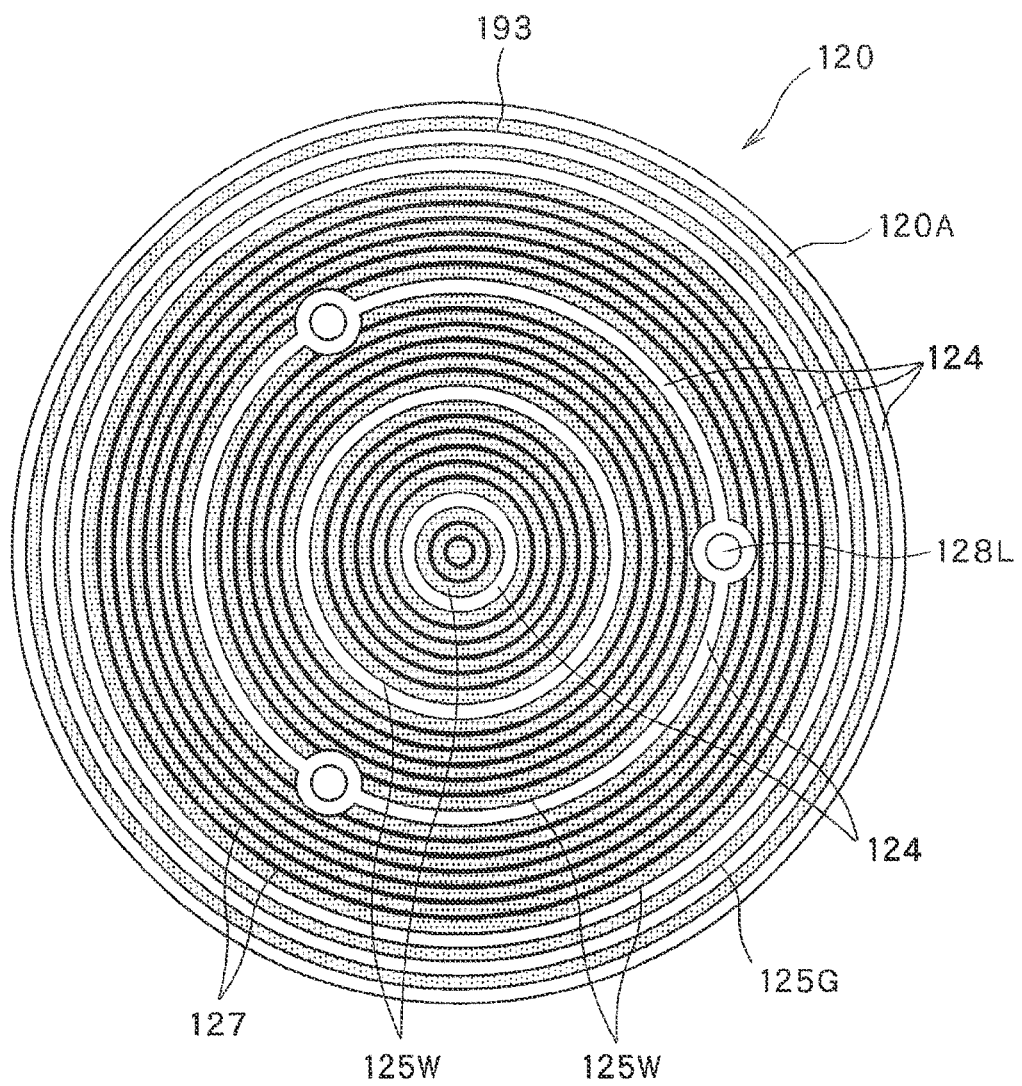
FIG. 6 is a schematic plan view illustrating an exemplary configuration of atop surface of the suction plate.
Figure 9:
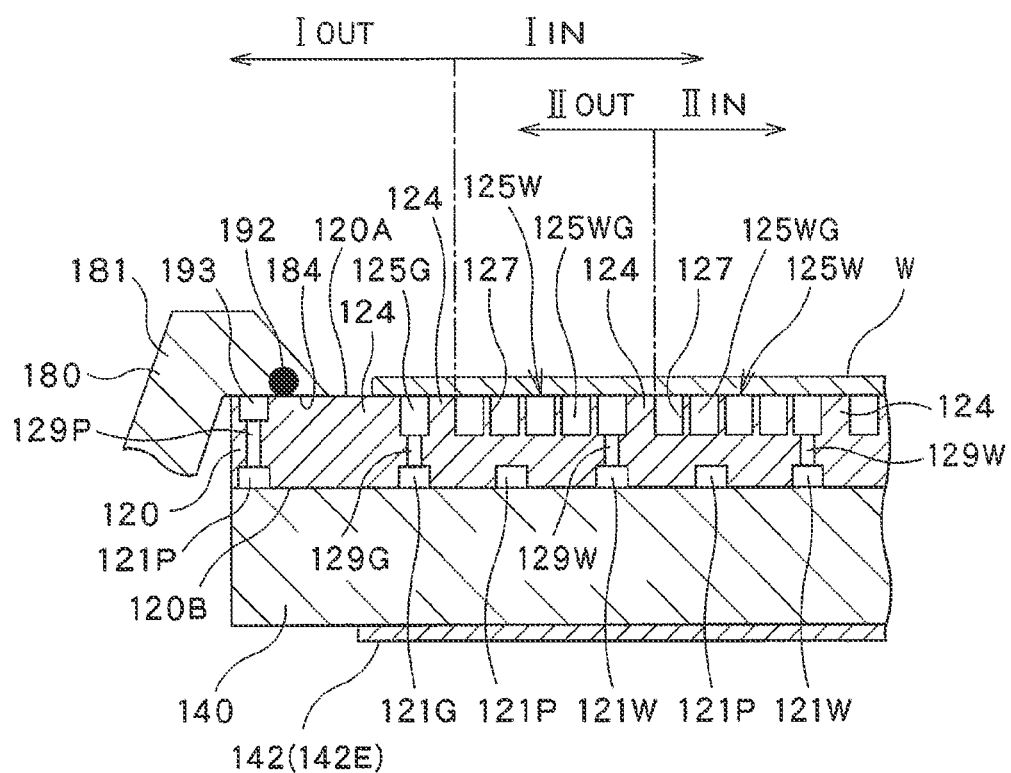
FIG. 9 is a schematic cross-sectional view of the suction plate illustrated in FIGS. 5 and 6.

As illustrated in FIGS. 6 and 9, a plurality of (five in the illustrated example) thick annular partition walls 124 is formed on the top surface 120A of the suction plate 120. The thick partition walls 124 define a plurality of concave regions 125W and 125G (four outer annular regions and the innermost circular region) separated from one another on the top surface 120A.

A plurality of through-holes 129W penetrating the suction plate 120 in a thickness direction thereof is formed at a plurality of locations in the substrate bottom surface suction flow path groove 121W, and each through-hole 129W makes the substrate bottom surface suction flow path groove 121W in communication with any one of the plurality of (four in the illustrated example) concave regions 125W.

In addition, a plurality of through-holes (129G) penetrating the suction plate 120 in the thickness direction thereof is formed at a plurality of locations in the bottom surface purge flow path groove 121G, and each through-hole 129G makes the bottom surface purge flow path groove 121G to be in communication with the outermost concave region 125G. The outermost concave region 125G is a single annular top surface purge flow path groove.

A plurality of substantially annular thin separation walls 127 is concentrically provided in each of the four inner concave regions 125W. The thin separation walls 127 form, in each concave region 125W, at least one top surface suction flow path groove 125WG, which meanders and extends in the corresponding concave region 125W. That is, the thin separation walls 127 evenly distribute a suction force in each concave region 125W.

As illustrated in FIG. 2, a suction/purge part 150 is provided in the vicinity of the rotation axis Ax. The suction/purge part 150 has a rotary joint 151 provided inside the hollow rotary shaft 200. A suction pipe 152W in communication with the plate suction ports 144P and the substrate suction port 144W in the hot plate 140 and a purge gas supply pipe 152G in communication with the purge gas supply ports 144G are connected to an upper piece 151A of the rotary joint 151.

Although not illustrated, the suction pipe 152W may be branched and branch suction pipes may be connected to the plate main body 141 of the hot plate 140 directly below the plate suction ports 144P and the substrate suction port 144W. In this case, through-holes extending in the vertical direction through the plate main body 141 may be formed in the plate main body 141, and the branch suction pipes may be connected to the through-holes, respectively.

Similarly, the purge gas supply pipe 152G may be branched and the branch purge gas supply pipes may be connected to the plate main body 141 of the hot plate 140 directly below the purge gas supply ports 144G. In this case, through-holes extending in the vertical direction through the plate main body 141 may be formed in the plate main body 141, and the branch purge gas supply pipes may be connected to the through-holes, respectively. The above-mentioned branch suction pipes or branch purge gas pipes are schematically illustrated in FIG. 10 (reference numerals 152WB and 152GB are assigned, respectively).

Instead of the above, the suction pipe 152W and the purge gas supply pipe 152G may be connected to a central portion of the plate main body 141 of the hot plate 140. In this case, a flow path configured to make the suction pipe 152W to be in communication with the plate suction ports 144P and the substrate suction port 144W and a flow path configured to make the purge gas supply pipe 152G to be in communication with the purge gas supply ports 144G are provided inside the plate main body 141.

A suction pipe 153W in communication with the suction pipe 152W and a purge gas supply pipe 153G in communication with the purge gas supply pipe 152G are connected to a lower piece 151B of the rotary joint 151. The rotary joint 151 is configured such that the upper piece 151A and the lower piece 151B are rotatable relative to each other while maintaining the communication between the suction pipes 152W and 153W and the communication between the purge gas supply pipes 152G and 153G. The rotary joint 151 itself having such a function is known.

The suction pipe 153W is connected to a suction device 154 such as a vacuum pump. The purge gas supply pipe 153G is connected to the purge gas supply device 155. The suction pipe 153W is also connected to the purge gas supply device 155. In addition, a switching device 156 (e.g., a three-way valve) configured to switch a connection destination of the suction pipe 153W between the suction device 154 and the purge gas supply device 155 is provided.

A plurality of temperature sensors 146 configured to detect a temperature of the plate main body 141 of the hot plate 140 is embedded in the hot plate 140. For example, one temperature sensor 146 may be provided in each of the ten heating zones 143-1 to 143-10. Based on deviations between detected values of the temperature sensors 146 and a target value (target temperature), power supplied to the heater element 142e in each of the heating zones 143-1 to 143-10 is controlled, for example, by a control function provided in the power feeder 300, which causes a temperature of each heating zone to be maintained at the target value. In addition, at least one thermoswitch 147 configured to detect overheating of the heater 142 is provided at a location close to the heater 142 of the hot plate 140.

In a space S between the hot plate 140 and the support plate 170, in addition to the temperature sensors 146 and the thermoswitch 147, control signal wires (first conductive line) 148A and 148B configured to transmit detection signals of the temperature sensors 146 and the thermoswitch 147, and a power feeding wire (first conductive line) 149 configured to feed power to each heater element 142E of the heater 142 are provided.

As illustrated in FIG. 2, a switch mechanism 160 is provided around the rotary joint 151. The switch mechanism 160 includes a first electrode part 161A that is fixed with respect to the direction of the rotation axis Ax, a second electrode part 161B that is movable in the direction of the rotation axis Ax, and an electrode moving mechanism 162 (a lifting mechanism) configured to move (vertically move) the second electrode part 161B in the direction of the rotation axis Ax. In addition, the first electrode part 161A and the second electrode part 161B may be relatively movable in the direction of the rotation axis Ax. That is, an electrode moving mechanism (not illustrated) may move the first electrode part 161A in the direction of the rotation axis Ax, and the second electrode part 161B may be fixed with respect to the direction of the rotation axis Ax.

Figure 7:
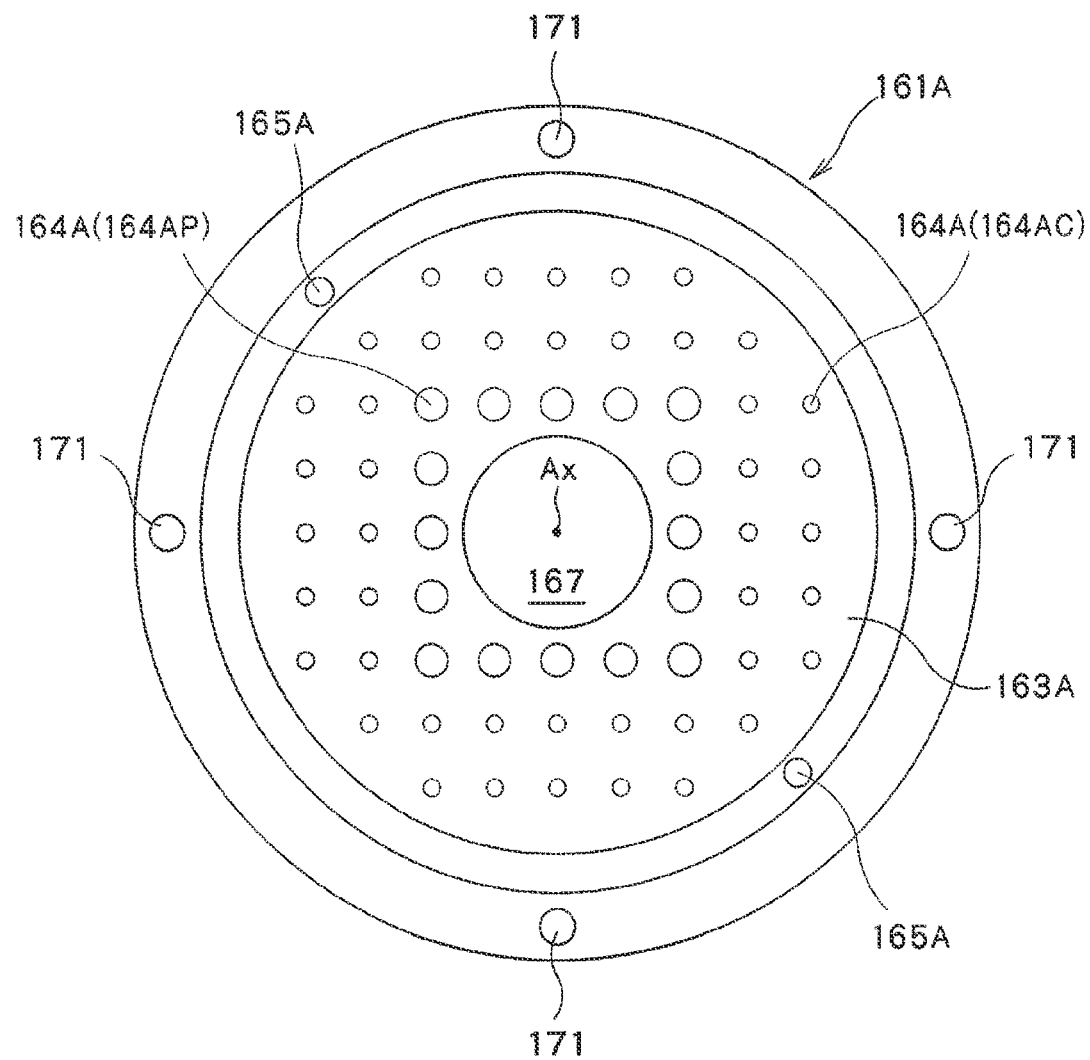
FIG. 7 is a schematic plan view illustrating an exemplary configuration of a first electrode provided in the processing unit.

As illustrated in FIG. 7, the first electrode part 161A includes a first electrode carrier 163A and a plurality of first electrodes 164A carried by the first electrode carrier 163A. The plurality of first electrodes 164A includes first electrodes 164AC for control signal communication (indicated by small circles in FIG. 7), which are connected to the control signal wires 148A and 148B, and first electrodes 164AP (indicated by large circles in FIG. 7) for feeding heater power, which are connected to the power supply wire 149.

The first electrode carrier 163A is a generally disk-shaped member having a substantially circular shape when viewed in the direction of the rotation axis Ax. A circular hole 167, into which the upper piece 151A of the rotary joint 151 is inserted, is formed in a central portion of the first electrode carrier 163A. The upper piece 151A of the rotary joint 151 may be fixed to the first electrode carrier 163A. A peripheral edge portion of the first electrode carrier 163A may be screw-fixed to the support plate 170 by using screw holes 171.

As schematically illustrated in FIG. 2, the second electrode part 161B includes a second electrode carrier 163B and a plurality of second electrodes 164B carried by the second electrode carrier 163B. The second electrode carrier 163B is a generally disk-shaped member having substantially the same diameter as the first electrode carrier 163A illustrated in FIG. 7. In a central portion of the second electrode carrier 163B, a circular hole having a size that allows the lower piece 151B of the rotary joint 151 to pass through the hole is formed.

The second electrodes 164B, which are brought into contact with and separated from the first electrodes 164A by moving vertically with respect to the first electrodes 164A, have the same planar arrangement as the first electrodes 164A. Hereinafter, the second electrodes 164B (power feeding electrodes), which are brought into contact with the first electrodes 164AP (power receiving electrodes) for feeding heater power, are also referred to as "second electrodes 164BP." In addition, the second electrodes 164B, which are brought into contact with the first electrodes 164AC for control signal communication, are also referred to as "second electrodes 164BC." The second electrodes 164BP are connected to a power output terminal of the power feeding device (power feeder) 300. The second electrodes 164BC are connected to control input/output terminals of the power feeder 300.

As illustrated in FIG. 7, the first electrodes 164AP for feeding heater power are provided in a central region of the first electrode carrier 163A, and the first electrodes 164AC for control signal communication are provided in an outer region outside the central region. The plurality of first electrodes 164AP will also be referred to as a first electrode group among the first electrodes 164A. The plurality of first electrodes 164AC will also be referred to as a second electrode group among the first electrodes 164A.

It is clear that the second electrodes 164B (the second electrodes 164BP and 164BC) are arranged at locations (horizontal positions and vertical positions) suitable for the paired first electrodes 164A (the first electrodes 164AP and 164AC). Thus, description on the arrangement of the second electrodes 164B will be omitted.

Conductive paths (second conductive lines) 168A, 168B, and 169 (see FIG. 2), which connect the respective second electrodes 164B to the power output terminal and the control input/output terminals of the power feeder 300, are at least partially formed of flexible electric wires. Due to the flexible electric wires, the entire second electrode part 161B can rotate around the rotation axis Ax by a predetermined angular range (in other words, a limited angular range) in each of a forward rotation direction and a reverse rotation direction from a neutral position, while the conduction between the second electrodes 64B and the power feeder 300 is maintained. This angular range may be, for example, 180 degrees, but is not limited thereto. This means that the rotary table 100 can be rotated approximately ±180 degrees while maintaining the connection between the first electrodes 164A and the second electrodes 164B.

One side of the paired first electrodes 164A and second electrodes 164B may be configured as pogo pins. In FIG. 2, all of the second electrodes 164B are formed as pogo pins. The term "pogo pin" is widely used to mean a telescopic rod-shaped electrode having a built-in spring. Instead of the pogo pins, electrical outlets, magnet electrodes, induction electrodes, or the like may be used as the electrodes.

It is desirable to provide a locking mechanism 165, which locks the first electrode carrier 163A and the second electrode carrier 163B in a relatively non-rotatable manner when the paired first electrodes 164A and second electrodes 164B are in proper contact with each other. For example, as illustrated in FIGS. 2 and 8, the locking mechanism 165 may be constituted with a hole 165A provided in the first electrode carrier 163A and a pin 165B provided in the second electrode carrier 163B and fit into the hole 165A.

It is also desirable to provide a sensor 172 (schematically illustrated in FIG. 2) configured to detect whether the paired first electrodes 164A and second electrodes 164B are in proper contact with each other. As such a sensor, an angular position sensor (not illustrated) configured to detect whether an angular positional relationship between the first electrode carrier 163A and the second electrode carrier 163B is in an appropriate state may be provided. As such a sensor, a distance sensor (not illustrated) configured to detect whether a distance between the first electrode carrier 163A and the second electrode carrier 163B in the direction of the rotation axis Ax is in an appropriate state may be provided. Further, a contact type sensor (see FIG. 8) configured to detect whether the pin 165B is appropriately fit into the hole 165A of the locking mechanism 165 may be provided.

Figure 8:
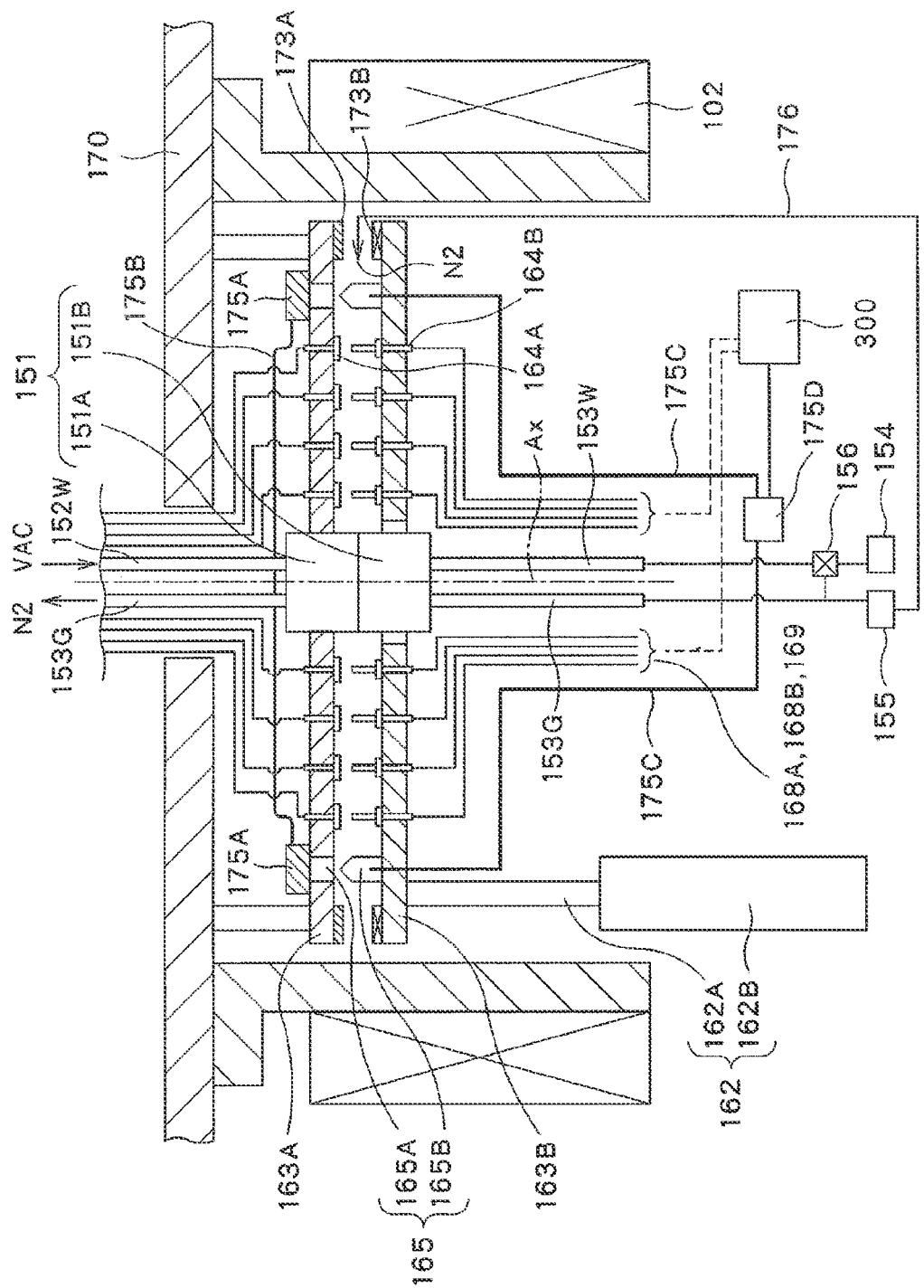
FIG. 8 is a schematic enlarged cross-sectional view illustrating a structure in a vicinity of the first electrode and a second electrode illustrated in FIG. 2.

In order to implement the contact type sensor illustrated in FIG. 8, two holes 165A and two pins 165B are provided. In some embodiments, the pins 165B may be formed of a conductive material, and the first electrode carrier 163A may be formed of an insulating material. The first electrode carrier 163A is provided with a conduction member which includes two electrodes 175A and a conduction member 175B electrically interconnecting these two electrodes 175A. The two electrodes 175A are provided at locations corresponding to the two holes 165A, respectively. The two pins 165B are connected to a conduction sensor 175D via a conductive member 175C. When the respective pins 165B are appropriately inserted into the corresponding holes 165A, tip ends of the pins 165B come into contact with the electrodes 175A, and the contact is detected by the conduction sensor 175D.

It is desirable to provide the power feeder 300 with a control function that enables power feeding to the electric heater 142 only when the conduction sensor 175D determines that the holes 165A and the pins 165B are appropriately fit to each other. In this case, it is possible to prevent electrodes or an electric circuit from being damaged due to occurrence of electric discharge between the first electrodes 164AP for feeding heater power and the second electrodes 164BP for feeding heater power.

As illustrated in FIG. 8, the electrode moving mechanism 162 schematically illustrated in FIG. 2 may include a push rod 162A configured to push up the second electrode carrier 163B and a lifting mechanism 162B (an air cylinder, a ball screw, or the like) configured to vertically mover the push rod 162A. At least one permanent magnet 173A may be provided on the first electrode carrier 163A, and at least one electromagnet 173B may be provided on the second electrode carrier 163B. The permanent magnet 173A and the electromagnet 173B form a part of the locking mechanism 165. As a result, when necessary, it is possible to couple the first electrode part 161A and the second electrode part 161B by an electromagnetic attraction force in a relatively vertically non-movable manner and to separate the first electrode part 161A and the second electrode part 161B from each other by an electromagnetic repulsive force. In some embodiments, a plurality of permanent magnets 173A and the same number of electromagnets 173B as the number of permanent magnets 173A may be provided and arranged at equal intervals in a circumferential direction about the rotation axis Ax.

As long as the coupling and separation of the first electrode part 161A and the second electrode part 161B are performed at the same angular position of the rotary table 100, the second electrode part 161B may not be supported to be rotatable around the rotation axis Ax. That is, there may be a member (e.g., the push rod 162A described above or a separate support table) configured to support the second electrode part 161B when the first electrode part 161A and the second electrode part 161B are separated from each other. When the first electrode part 161A and the second electrode part 161B are coupled to each other by, for example, an electromagnetic force, the second electrode part 161B may be spaced apart from a member that supports the second electrode part 161B (e.g., the push rod 162A or a separate support table).

The electric drive part 102 of the rotary table 100 has a positioning function for stopping the rotary table 100 at an arbitrary rotation angle position. The positioning function may be implemented by rotating a motor of the electric drive part 102 based on a detection value of a rotary encoder installed on the rotary table 100 (or a member rotated by the rotary table 100). By moving up the second electrode part 161B by the electrode moving mechanism 162 in a state in which the rotary table 100 is stopped at a predetermined rotation angle position, the corresponding electrodes of the first and second electrode parts 161A and 161B are brought into appropriate contact with each other. When separating the second electrode part 161B from the first electrode part 161A, it is desirable to perform the separation in the state in which the rotary table 100 is stopped at the predetermined rotation angle position.

As described above, a plurality of electrical components (heaters, wirings, and sensors) are arranged in the space S between the suction plate 120 and the support plate 170 and at locations facing the space S. The peripheral edge cover body 180 prevents a processing liquid supplied to the wafer W, particularly a corrosive chemical liquid, from entering the space S to protect the electrical components. A purge gas ($N_2$ gas) may be supplied to the space S via a pipe (not illustrated) branched from the purge gas supply pipe 152G. In this case, it is possible to prevent a corrosive gas derived from the chemical liquid from infiltrating into the space S from the outside of the space S, so that the inside of the space S can be maintained in a non-corrosive atmosphere.

In particular, it is desirable to provide an inert gas supply mechanism configured to supply an inert gas ($N_2$ gas) in a space SE between the first electrode carrier 163A and the second electrode carrier 163B, in which the first electrodes 164A of the first electrode part 161A and the second electrodes 164B of the second electrode part 161B are brought into contact with each other. This inert gas supply mechanism may be constituted with the purge gas supply device 155 and an inert gas supply pipe 176 configured to supply $N_2$ gas as an inert gas from the purge gas supply device 155 to the space SE. That is, the purge gas supply device 155 that supplies the $N_2$ gas as the purge gas into the space S is also used as the inert gas supply apparatus that supplies the $N_2$ gas as the inert gas to the space SE. During the operation of the processing unit 16, it is desirable to supply the inert gas into the space SE continuously. This makes it possible to improve operational reliability of the processing unit 16 because front surfaces of the electrodes are maintained in a good state.

In order to supply the inert gas ($N_2$ gas) to the space SE, a dedicated inert gas source independent of the purge gas supply device 155 may be used. In addition, when the space SE is filled with the $N_2$ gas by supplying the $N_2$ gas as the purge gas into the space S, it is not necessary to provide the inert gas supply mechanism dedicated to the space SE.

As illustrated in FIG. 2, the peripheral edge cover body 180 includes an upper portion 181 and a side peripheral portion 182, and a lower portion 183. The upper portion 181 protrudes upward from the suction plate 120 and is connected to the suction plate 120. The lower portion 183 of the peripheral edge cover body 180 is connected to the support plate 170.

An inner peripheral edge of the upper portion 181 of the peripheral edge cover body 180 is located radially inward of an outer peripheral edge of the suction plate 120. The upper portion 181 includes an annular bottom surface 184 in contact with the top surface of the suction plate 120, an inclined annular inner peripheral surface 185 standing upright from an inner peripheral edge of the bottom surface 184, and an annular outer peripheral surface 186 extending radially outward from an outer peripheral edge of the inner peripheral surface 185 in a substantially horizontal manner. The inner peripheral surface 185 is inclined to become lower toward the central portion of the suction plate 120.

It is desirable to provide a seal between the top surface 120A of the suction plate 120 and the bottom surface 184 of the upper portion 181 of the peripheral edge cover body 180 in order to prevent infiltration of liquid. The seal may be an O-ring 192 (see FIG. 9) disposed between the top surface 120A and the bottom surface 184.

As illustrated in FIG. 5, a part of the plate bottom surface suction flow path groove 121P extends in the circumferential direction in the outermost peripheral portion of the suction plate 120. In addition, as illustrated in FIG. 6, a concave groove 193 extends continuously in the circumferential direction in the outermost peripheral portion of the top surface 120A of the suction plate 120. As illustrated in FIG. 9, the bottom surface suction flow path groove 121P and the concave groove 193 in the outermost peripheral portion are in communication with each other via a plurality of through-holes 129P, which is provided at intervals in the circumferential direction and penetrates the suction plate 120 in the thickness direction. The bottom surface 184 of the upper portion 181 of the peripheral edge cover body 180 is placed on the concave groove 193. Therefore, the bottom surface 184 of the upper portion 181 of the peripheral edge cover body 180 is suctioned to the top surface 120A of the suction plate 120 by a negative pressure acting on the plate bottom surface suction flow path groove 121P. By this suction, the O-ring 192 is pressed so that a reliable seal is implemented.

A height of the outer peripheral surface 186, that is, a top portion of the peripheral edge cover body 180 is higher than a height of the top surface of the wafer W held by the suction plate 120. Accordingly, when the processing liquid is supplied to the top surface of the wafer W in a state where the wafer W is held by the suction plate 120, a liquid pool is formed so that the wafer W can be immersed such that the top surface of the wafer W is located below a liquid level LS (see FIG. 2). That is, the upper portion 181 of the peripheral edge cover body 180 forms a bank surrounding the wafer W held by the suction plate 120, so that a recess in which the processing liquid can be stored is formed by the upper portion 181 of the peripheral edge cover body 180 and the suction plate 120. With this configuration, it is also possible to perform an immersion process of the wafer.

The inclination of the inner peripheral surface 185 of the upper portion 181 of the peripheral edge cover body 180 makes it easy to smoothly scatter the processing liquid within the above-mentioned recess (tank) to the outside when the rotary table 100 is rotated at a high speed. That is, with this inclination, it is possible to prevent the liquid from staying on the inner peripheral surface of the upper portion 181 of the peripheral edge cover body 180 when the rotary table 100 is rotated at a high speed.

In the chemical liquid processing disclosed in the present specification (details ill be described later), the wafer W is not immersed in a bath of the processing liquid, but a liquid pooling process for forming a puddle on the front surface of the wafer W is performed. When the wafer W is not immersed, the height of the upper portion 181 of the peripheral edge cover body 180 may be lower than that in the illustrated example, and the inclination of the inner peripheral surface 185 may also be gentler than that in the illustrated example.

A rotary cup 188 (a rotary liquid receiving member), which rotates together with the peripheral edge cover body 180, is provided radially outward of the peripheral edge cover body 180. The rotary cup 188 is connected to a component of the rotary table 100 (the peripheral edge cover body 180 in the illustrated example) via a plurality of connecting members 189 provided at intervals in the circumferential direction. The upper end of the rotary cup 188 is located at a height capable of receiving the processing liquid scattered from the wafer W. A passage 190 through which the processing liquid scattered from the wafer W flows down is formed between an outer peripheral surface of the side peripheral portion 182 of the peripheral edge cover body 180 and an inner peripheral surface of the rotary cup 188.

The liquid receiving cup 800 surrounds the periphery of the rotary table 100 and collects the processing liquid scattered from the wafer W. In the illustrated embodiment, the liquid receiving cup 800 includes a fixed outer cup element 801, a fixed inner cup element 804, and a first movable cup element 802 and a second movable cup element 803 which are movable vertically. A first discharge passage 806, a second discharge passage 807, and a third discharge passage 808 are respectively formed between two adjacent cup elements (between the cup elements 801 and 802, between the cup elements 802 and 803, and between the cup elements 803 and 804). By changing positions of the first and second movable cup elements 802 and 803, the processing liquid flowing out from the passage 190 between the peripheral edge cover body 180 and the rotary cup 188 can be guided to one selected from the three discharge passages 806, 807, and 808. Each of the first discharge passage 806, the second discharge passage 807, and the third discharge passage 808 is connected to one of an acid-based liquid drainage passage, an alkaline-based liquid drainage passage, and an organic-based liquid drainage passage (all of which are not illustrated in the figure) installed in a semiconductor manufacturing factory. A gas-liquid separation structure (not illustrated) is provided in each of the first discharge passage 806, the second discharge passage 807, and the third discharge passage 808. The first discharge passage 806, the second discharge passage 807, and the third discharge passage 808 are connected to and suctioned by a factory exhaust system via an exhaust device (not illustrated) such as an ejector. The above-described liquid receiving cup 800 is known by, for example, Japanese Laid-Open Patent Publication No. 2012-129462 and Japanese Laid-Open Patent Publication No. 2014-123713, which are laid-open patent publications related to patent applications filed by the applicant, and for details, refer to these laid open publications.

Three lift pin holes 128L and three lift pin holes 171L are also formed in the suction plate 120 and the support plate 170, respectively, to be aligned with the three lift pin holes 145L of the hot plate 140 in the direction of the rotation axis Ax.

The rotary table 100 is provided with a plurality of (three in the illustrated example) lift pins 211 that penetrate the lift pin holes 145L, 128L, and 171L. Each lift pin 211 is movable between a delivery position (a raised position) at which the upper end of the lift pin 211 protrudes upward from the top surface 120A of the suction plate 120 and a processing position (a lowered position) at which the upper end of the lift pin 211 is located below the top surface 120A of the suction plate 120.

A push rod 212 is provided below each lift pin 211. The push rod 212 can be moved vertically by a lifting mechanism 213 (e.g., an air cylinder). By pushing up the lower end of the lift pin 211 by the push rod 212, the lift pin 211 can be raised to the delivery position. A plurality of push rods 212 may be provided on a ring-shaped support (not illustrated) centered on the rotation axis Ax, so that the push rods 212 can be moved vertically by vertically moving the ring-shaped support by a common lifting mechanism.

The wafer W placed on the lift pins 211 at the delivery position is located at a height higher than an upper end 809 of the fixed outer cup element 801, so that the wafer W can be delivered to and from an arm of the substrate transfer device 17 (see FIG. 1) that has been introduced into the processing unit 16.

When the lift pin 211 is separated from the push rod 212, the lift pin 211 is lowered to the processing position by an elastic force of a return spring 214 and held at the processing position.

In FIG. 2, reference numeral 215 denotes a guide member configured to guide the vertical movement of the lift pin 211, and reference numeral 216 denotes a spring receiver configured to receive the return spring 214. In addition, an annular recess 810 configured to allow the spring receiver 216 to rotate around the rotation axis Ax is formed in the fixed inner cup element 804.

The processing liquid supplier 700 includes a plurality of nozzles. The nozzles include a chemical liquid nozzle 701, a rinse nozzle 702, and a drying promoting liquid nozzle 703. A chemical liquid is supplied to the chemical liquid nozzle 701 from a chemical liquid source 701A via a chemical liquid supply mechanism 701B including flow control devices (not illustrated), such as an opening/closing valve and a flow rate control valve, which are provided in a chemical liquid supply line (a pipe) 701C. A rinsing liquid is supplied from a rinsing liquid source 702A via a rinsing liquid supply mechanism 702B including flow control devices (not illustrated), such as an opening/closing valve and a flow rate control valve, which are provided in a rinsing liquid supply line (a pipe) 702C. A drying promoting liquid (e.g., isopropyl alcohol (IPA)) is supplied from a drying promoting liquid source 703A via a drying promoting liquid supply mechanism 703B including flow control devices (not illustrated), such as an opening/closing valve and a flow rate control valve, which are provided in a drying promoting liquid supply line (a pipe) 703C.

A heater 701D may be provided in the chemical liquid supply line 701C as a temperature control mechanism for controlling a temperature of the chemical liquid. In addition, a tape heater (not illustrated) for controlling the temperature of the chemical liquid may be provided in a pipe constituting the chemical liquid supply line 701C. Such heaters may also be provided in the rinsing liquid supply line 702C.

The chemical liquid nozzle 701, the rinse nozzle 702, and the drying promoting liquid nozzle 703 are supported by a tip end of a nozzle arm 704. A base end of the nozzle arm 704 is supported by a nozzle arm drive mechanism 705 configured to vertically move and rotate the nozzle arm 704. By the nozzle arm drive mechanism 705, the chemical liquid nozzle 701, the rinse nozzle 702, and the drying promoting liquid nozzle 703 can be positioned at arbitrary radial positions above the wafer W (positions with respect to the radial direction of the wafer W).

On the ceiling of the housing 1601, there are provided a wafer sensor 860 configured to detect whether or not a wafer W is present on the rotary table 100, and one or more infrared thermometers 870 (only one is illustrated) configured to detect a temperature of the wafer W (or the temperature of the processing liquid on the wafer W). When a plurality of infrared thermometers 870 is provided, it is desirable that the infrared thermometers 870 respectively detect temperatures in region of the wafer W which correspond to the heating zones 143-1 to 143-10.

Figure 11A:
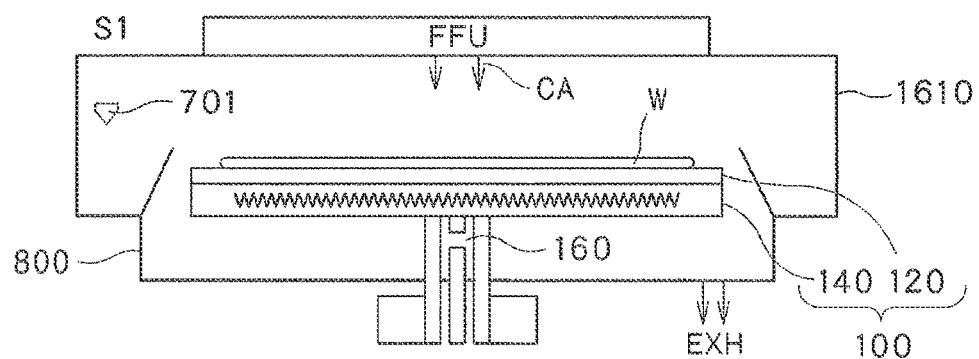
FIGS. 11A to 11P are views illustrating a procedure of chemical liquid processing.
Figure 11B:
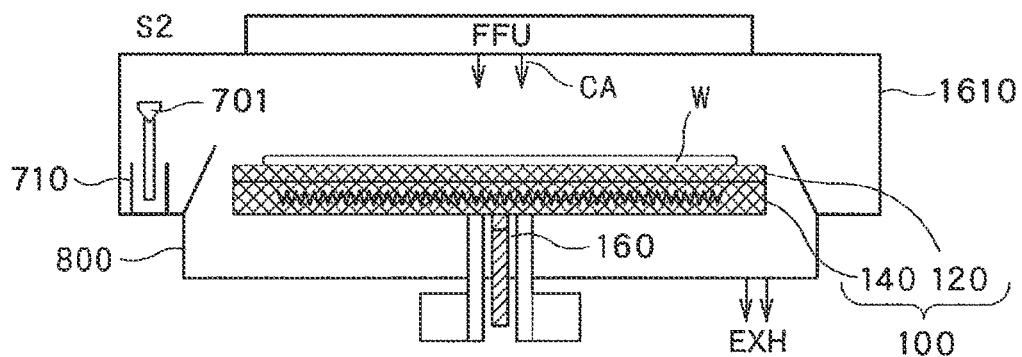

Next, with reference to FIGS. 11A to 11P, operations of the substrate processing apparatus will be described by taking as an example a case in which liquid processing is performed on a wafer W. The chemical liquid may be, for example, a chemical liquid for a wet etching process or a chemical liquid for a cleaning process. In FIGS. 11A to 11P, the number of arrows extending downward from an FFU substantially corresponds to a flow rate of a gas supplied from the FFU into the processing chamber 1601. Reference symbol CA denotes clean air, and reference symbol DA denotes dry air. An exhaust flow rate from the liquid receiving cup 800 substantially corresponds to the number of arrows assigned with the reference symbol EXH. In addition, reference symbols S1 to S16 described on the left-hand side of the FFU in each of FIGS. 11A to 11P denote that the drawings correspond to steps S1 to S16, respectively.

In the following description, processing parameters will be indicated as follows for the sake of simplification of the description.

The item "plate heating switch" indicates a state of the switch mechanism 160. The item "ON" indicates a state in which the second electrode part 161B of the switch mechanism 160 rises and comes into electrical contact with the first electrode part 161A to feed power to the hot plate 140. The item "OFF" indicates a state in which the second electrode part 161B of the switch mechanism 160 is lowered and separated from the first electrode part 161A (an open state).

The item "plate temperature" indicates a temperature of the suction plate 120 of the rotary table 100 on which the wafer W is placed. The temperature of the suction plate 120 rises as it is heated by the hot plate 140. After a certain amount of time has passed since the wafer W was suctioned and integrated to the suction plate 120, the temperature of the wafer W may be considered to be substantially equal to the temperature of the suction plate 120.

The item "wafer rotation" indicates a rotation number of the wafer W rotated by the rotary table 100. In a case of continuous rotation in the same direction, only the rotation number will be indicated, whereas in a case of oscillating rotation (alternate rotation in forward and reverse directions), that fact will be noted.

The item "chemical liquid nozzle" indicates whether or not the chemical liquid is ejected from the chemical liquid nozzle 701, and a position of the chemical liquid nozzle 701 (which will be described only at the time of ejection).

The item "rinse nozzle" indicates the presence or absence of ejection of the rinsing liquid (herein, DIW) from the rinse nozzle 702, and a position of the rinse nozzle 702 (described only at the time of ejection).

The item "IPA nozzle" indicates the presence or absence of ejection of IPA as a drying promoting liquid from the drying promoting liquid nozzle 703, and a position of the drying promoting liquid nozzle 703 (described only at the time of ejection).

In FIGS. 11A to 11P, an air supply from a fan filter unit (FFU) (see FIG. 2)) into the housing (the processing chamber) 1610 is indicated by arrows. When the number of arrows is large, an air supply flow rate is also large. Reference symbol CA denotes clean air and reference symbol DA denotes dry air. In addition, gas exhaust (EXH) from the liquid receiving cup 800 is indicated by arrows, and when the number of arrows is large, an exhaust flow rate is also large.

[Step S1 (Wafer Holding Step)]

The arm (see FIG. 1) of the substrate transfer device 17 holding a wafer W at normal temperature (e.g., about 24 degrees C.) is introduced into the processing unit 16 and located directly above the suction plate 120 at normal temperature (e.g., about 24 degrees C.). In addition, the lift pins 211 are located at the delivery position. In this state, the arm of the substrate transfer device 17 is lowered, whereby the wafer W is placed on the upper ends of the lift pins 211 and separated from the arm. Subsequently, the arm of the substrate transfer device 17 is retracted from the processing unit 16. Subsequently, the suction device 154 is operated to suction the suction plate 120 to the hot plate 140, and a suction force starts to act on the front surface of the suction plate 120. In this state, the lift pins 211 are lowered to the processing position, and in the course of that process, the wafer W is placed on the top surface 120A of the suction plate 120 and immediately suctioned to the suction plate 120.

Thereafter, the wafer sensor 860 inspects whether the wafer W is appropriately suctioned to the suction plate 120. When the wafer W is suctioned to the suction plate 120, heat is transferred from the hot plate 140 to the wafer W via the suction plate 120. Therefore, the wafer W can be efficiently heated, and a temperature control can be accurately performed for each heating zone.

A purge gas (e.g., $N_2$ gas) is continuously supplied from the purge gas supply device 155 to the outermost concave region 125G on the top surface of the suction plate 120. As a result, even when there is a gap between a peripheral edge portion of the bottom surface of the wafer W and a peripheral edge portion of the suction plate 120, the processing liquid does not go between the peripheral edge portion of the wafer W and the peripheral edge portion of the suction plate 120 from the gap.

A process condition in step S1 is as follows. Hereinafter, even when there is no particular description in the description of other steps, the air supply flow rate into the chamber may be slightly larger than the exhaust flow rate from the cup in order to maintain the interior of the processing chamber 1610 at a slightly positive pressure.

Plate heating switch: OFF
Plate temperature: 24 degrees C. (23 to 27 degrees C.)
Rotation number of wafer: 0 rpm
Chemical liquid nozzle: No ejection
Rinse nozzle: No ejection
IPA nozzle: No ejection

[Step S2 (Preheating Step)]

Subsequently, the switch mechanism 160 is turned on so that power is fed to the hot plate 140 to generate heat, whereby the suction plate 120 and the wafer W suctioned to the suction plate 120 are heated to 60 degrees C., which is the same temperature as a chemical liquid processing temperature to be described later. At this time, the wafer W may be heated to a temperature slightly higher than the chemical liquid processing temperature (e.g., about 65 degrees C.). In this case, the temperatures of the suction plate 120 and the wafer W at the start of step S5 (the temperatures drop due to heat dissipation), which will be described later, can be made substantially equal to the chemical liquid processing temperature. Thus, it is possible to prevent hunting, overshoot, and the like from occurring immediately after a start of a temperature control. During the preheating step, dummy dispensing of the chemical liquid may be performed from the chemical liquid nozzle 701 toward a dummy dispensing port (denoted by reference numeral 710 and schematically illustrated only in FIG. 11B).

A process condition in step S2 is as follows.
Plate heating switch: ON
Plate temperature: 60 degrees C.
Rotation number of wafer: 0 rpm
Chemical liquid nozzle: No ejection or dummy dispense
Rinse nozzle: No ejection
IPA nozzle: No ejection

[Step S3]

Figure 11C:
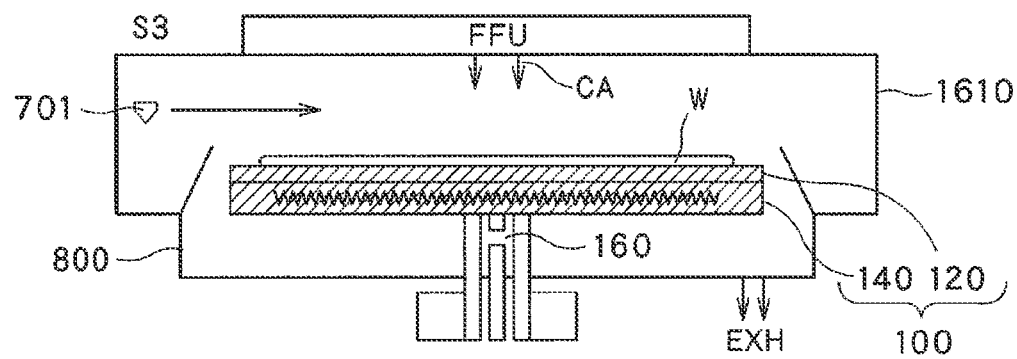

Subsequently, as illustrated in FIG. 11C, the switch mechanism 160 is turned off. As a result, the temperatures of the suction plate 120 and the wafer W gradually decrease. In addition, the chemical liquid nozzle 701 is moved to a position directly above a central portion of the wafer W. A process condition in step S3 is as follows.

Plate heating switch: OFF
Plate temperature: Not controlled (gradually decreasing due to heat dissipation)
Rotation number of wafer: 0 rpm
Chemical liquid nozzle: No ejection (moving to the position directly above the central portion of the wafer W)
Rinse nozzle: No ejection
IPA nozzle: No ejection

[Step S4 (Liquid Film Forming Step and Film Thickness Control Step)]

Figure 11D:
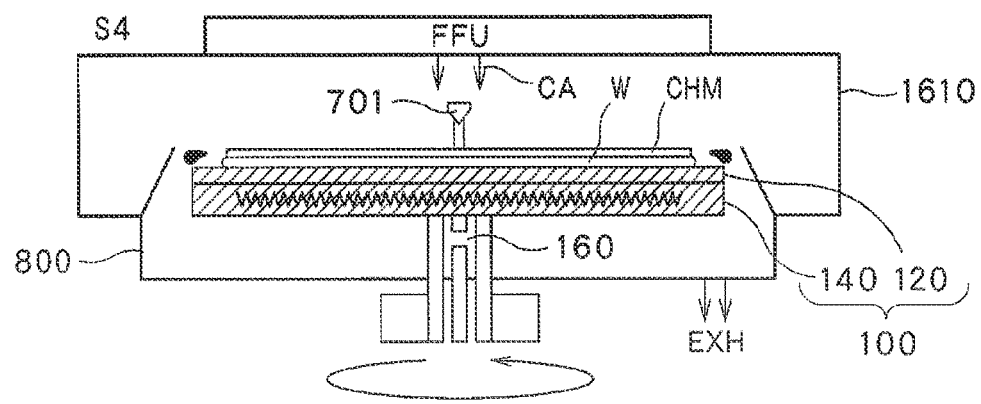

Subsequently, as illustrated in FIG. 11D, in a state in which the wafer W is rotated at a high speed (e.g., 500 rpm or more, specifically, for example, about 1,000 rpm), the chemical liquid having a temperature of about 60 degrees C. is supplied from the chemical liquid nozzle 701 to the center of the wafer W. Then, while continuing to supply the chemical liquid to the center of the wafer W from the chemical liquid nozzle 701, a rotation speed of the wafer W is reduced to a low speed of about 10 rpm.

The chemical liquid supplied to the central portion of the wafer W rotating at a high speed spreads instantly (e.g., within less than one second) over the entire surface of the wafer W due to a centrifugal force. As a result, the entire surface of the wafer W is covered with a thin chemical liquid film. This step may be regarded as a pre-wet step executed prior to a chemical puddle formation step to be described later. By instantly spreading the chemical liquid over the entire surface of the wafer W, in-plane uniformity of a contact time between the front surface of the wafer W and the chemical liquid is enhanced, and as a result, in-plane uniformity of the chemical liquid processing is enhanced.

After spreading over the entire surface of the wafer W rotating at a high speed (e.g., 500 rpm or more), the rotation speed of the wafer W is reduced (e.g., to ½ or less of the rotation speed of the high speed rotation, specifically, for example, about 10 rpm) while the chemical liquid is continuously supplied to the center of the wafer W, so that a liquid film of the chemical liquid (also referred to as a "chemical liquid puddle") having a desired thickness can be formed on the front surface of the wafer W.

The liquid film of the chemical liquid (denoted by reference symbol "CHM") may have a thickness that does not cause a problem in processing results due to evaporation of the chemical liquid. In this step S4, a total amount of the chemical liquid supplied from the chemical liquid nozzle 701 to the wafer W is, for example, 100 ml or less. In addition, in step S4, a temperature of the chemical liquid supplied from the chemical liquid nozzle 701 to the wafer W may be set to, for example, an appropriate temperature that is equal to or higher than normal temperature and equal to or lower than a chemical liquid processing temperature Tc, as long as the temperature of the chemical liquid existing on the wafer W can be maintained at about 60 degrees C.

A process condition in step S4 is as follows.
Plate heating switch: OFF
Plate temperature: Not controlled (gradually decreasing due to heat dissipation)
Rotation number of wafer: 1,000 rpm→10 rpm
Chemical liquid nozzle: Ejecting the chemical liquid from the position directly above the central portion of the wafer W
Rinse nozzle: No ejection
IPA nozzle: No ejection All the chemical liquid supplied to the wafer W is that supplied in step S4. The total amount of the chemical liquid supplied in step S4 of forming the puddle of the chemical liquid is about ⅕ to 1/10 of the total amount of the chemical liquid used in the conventional chemical liquid processing performed by continuously supplying a temperature-controlled chemical liquid to a rotating wafer W.

[Step S5 (Liquid Film Heating Step)]

Figure 11E:
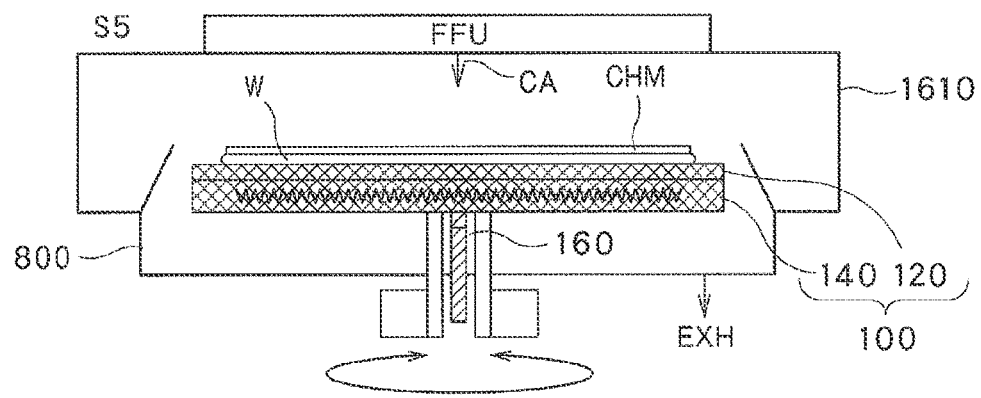

Subsequently, the rotation of the wafer W is stopped, and the switch mechanism 160 is turned on so that the hot plate 140 is fed with power to generate heat. Therefore, the temperatures of the suction plate 120, the wafer W suctioned to the wafer W, and the chemical liquid on the wafer W are maintained at 60 degrees C., which is the above-mentioned chemical liquid processing temperature Tc. In addition, as illustrated in FIG. 11E, the rotary table 100 (the suction plate 120 and the wafer W) performs oscillating rotation to stir the chemical liquid forming the liquid film on the wafer W, so that reaction between the chemical liquid and the front surface of the wafer W is promoted and uniformity of the reaction is improved. The oscillating rotation may be, for example, alternately repeating a forward rotation of 45 degrees and a reverse rotation of 45 degrees. The oscillating angle may be changed depending on physical characteristics (e.g., viscosity) of the chemical liquid. From the viewpoint of processing uniformity, it is desirable to perform the oscillating rotation, but the rotation may be simply stopped without performing the oscillating rotation.

At this time, the chemical liquid nozzle 701 may be returned to a home position. However, when the chemical liquid nozzle 701 and the rinse nozzle 702 are arranged at the tip end of the same nozzle arm 704 as illustrated in FIG. 2, the chemical liquid nozzle 701 (i.e., also the rinse nozzle 702) may be continuously located at the position directly above the central portion of the wafer W. This point is also the same in a relationship between the rinse nozzle 702 and the drying promoting liquid nozzle 703.

A process condition in step S5 is as follows.
Plate heating switch: ON
Plate temperature: 60 degrees C.
Rotation number of wafer: Oscillating rotation
Chemical liquid nozzle: No ejection
Rinse nozzle: No ejection
IPA nozzle: No ejection

[Step S6]

Figure 11F:
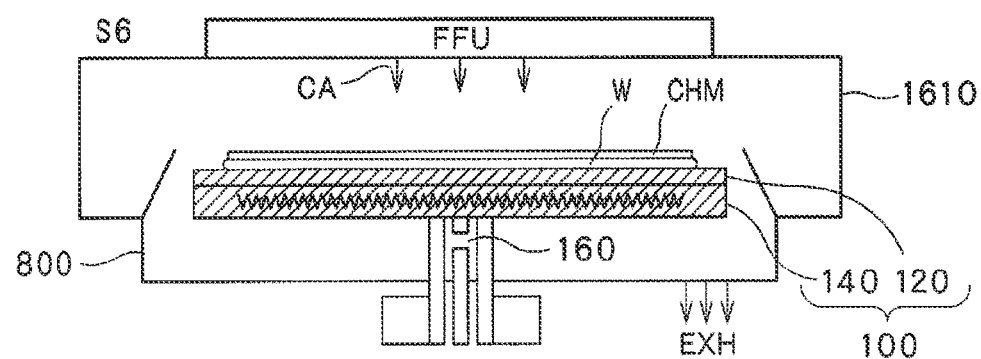

Subsequently, as illustrated in FIG. 11F, the switch mechanism 160 is turned off. As a result, the temperatures of the suction plate 120 and the wafer W gradually decrease. In addition, the rinse nozzle 702 (not illustrated in FIG. 11F) is located at a position directly above the central portion of the wafer W or is moved toward the position directly above the central portion.

A process condition in step S6 is as follows.
Plate heating switch: OFF
Plate temperature: Not controlled (gradually decreasing due to heat dissipation)
Rotation number of wafer: 0 rpm
Chemical liquid nozzle: No ejection
Rinse nozzle: No ejection (moving to the position directly above the central portion of the wafer W)
IPA nozzle: No ejection

[Step S7]

Figure 11G:
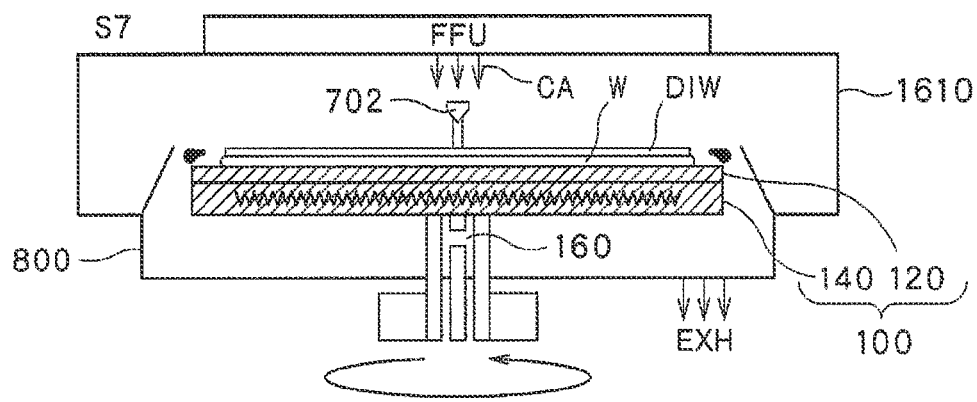

Subsequently, as illustrated in FIG. 11G, in a state in which the wafer W is rotated at a relatively low speed (e.g., 100 rpm or less, specifically about 30 rpm), a rinsing liquid at normal temperature (here, pure water (DIW)) is supplied from the rinse nozzle 702 to the center of the wafer W. As a result, the chemical liquid on the front surface of the wafer W is washed away, and the reaction between the chemical liquid and the front surface of the wafer W is stopped.

A process condition in step S7 is as follows.
Plate heating switch: OFF
Plate temperature: Not controlled (gradually decreasing due to heat dissipation and DIW)
Rotation number of wafer: 10 rpm
Chemical liquid nozzle: No ejection
Rinse nozzle: Ejecting DIW from the position directly above the central portion of the wafer W
IPA nozzle: No ejection

[Step S8]

Figure 11H:
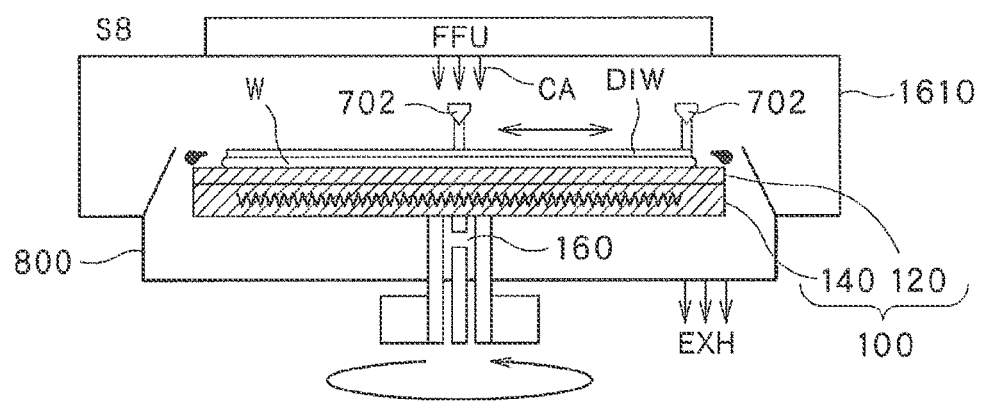

Subsequently, as illustrated in FIG. 11H, the rotation speed of the wafer W is increased to a high speed of about 1,000 rpm while the DIW is continuously supplied from the rinse nozzle 702 to the center of the wafer W. The DIW supplied to the central portion of the wafer W rotating at a high speed flows and spreads toward the peripheral edge of the wafer W, and scatters to the outside of the peripheral edge. As a result, the chemical liquid, the reaction product, and the like remaining on the front surface of the wafer W are washed away by the DIW. In addition, in this step S7, the wafer W and the suction plate 120 are deprived of heat by the DIW at normal temperature so that the temperatures thereof drop to approximately normal temperature. In this step ST in order to uniformly decrease the temperatures of the wafer W and the suction plate 120, the rinse nozzle 702 reciprocates between the position directly above the center of the wafer W and the position directly above the peripheral edge of the wafer W. In addition, when the rinse nozzle 702 is reciprocated, an ejection amount of DIW from the rinse nozzle 702 may be changed depending on the ejection position. Thus, a more uniform temperature drop can be implemented.

A process condition in step S8 is as follows.
Plate heating switch: OFF
Plate temperature: Not controlled (gradually decreasing to approximately normal temperature due to heat dissipation and DIW)
Rotation number of wafer: 1,000 rpm
Chemical liquid nozzle: No ejection
Rinse nozzle: Ejecting DIW while reciprocating between the central portion and the peripheral edge portion of the wafer W
IPA nozzle: No ejection

[Step S9]

Figure 11I:
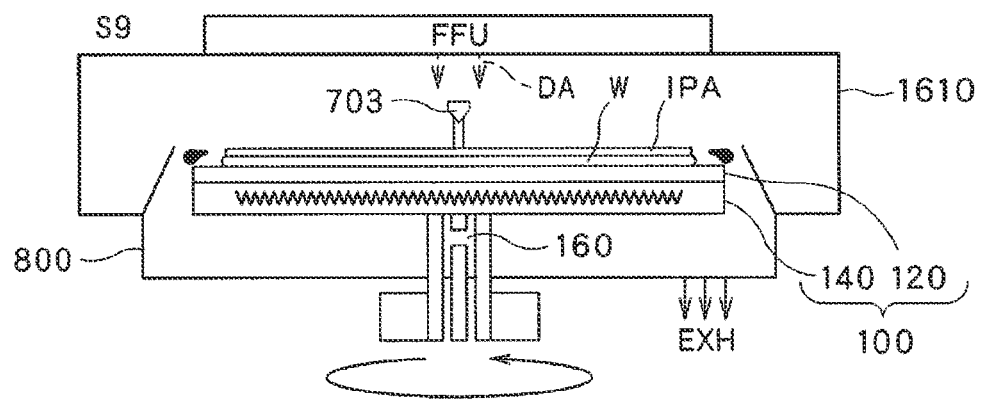

Subsequently, as illustrated in FIG. 11I, while maintaining the rotation speed of the wafer W, the ejection of DIW from the rinse nozzle 702 is stopped, and IPA at normal temperature is ejected to the central portion of the wafer W from the drying promoting liquid nozzle 703 located directly above the central portion of the wafer W. In step S9, the rinsing liquid on the wafer W is replaced by the IPA ejected to the central portion of the wafer W. and the front surface of the wafer W is covered with a liquid film of the IPA.

A process condition in step S9 is as follows.
Plate heating switch: OFF
Plate temperature: Not controlled (approximately normal temperature)
Rotation number of wafer: 1,000 rpm
Chemical liquid nozzle: No ejection
Rinse nozzle: No ejection
IPA nozzle: Ejecting IPA from the position directly above the central portion of the wafer W

[Step S10]

Figure 11J:
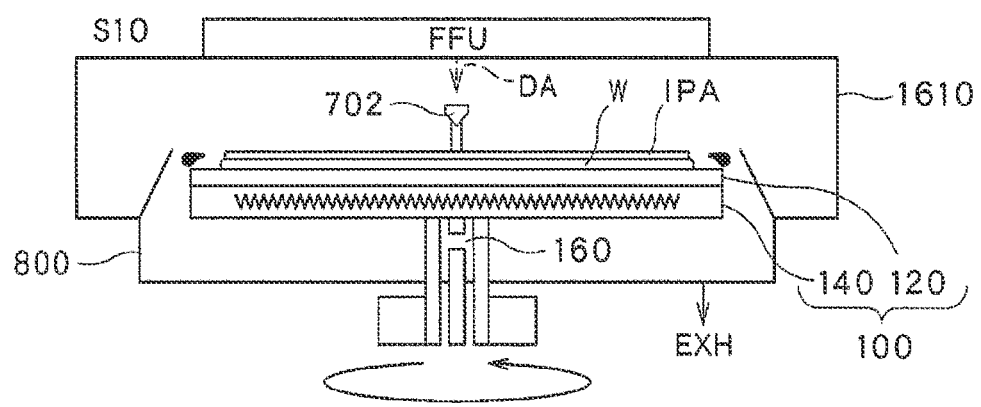

Subsequently, as illustrated in FIG. 11J, the rotation speed of the wafer W is reduced to a low speed of about 10 rpm while the IPA at normal temperature is continuously supplied from the drying promoting liquid nozzle 703 to the center of the wafer W. A liquid film of IPA having a desired film thickness (also referred to as an "IPA puddle") can be formed on the front surface of the wafer W by reducing the rotation speed of the wafer W while continuously supplying the IPA to the center of the wafer W. The liquid film of the IPA may have a thickness that does not cause a problem in processing results due to evaporation of the IPA.

By supplying the IPA at normal temperature in steps S9 and S10, a filtration efficiency of a filter provided in the IPA supply line is substantially increased so that cleanliness of the IPA supplied to the wafer W can be increased. Under a high temperature, the filtration efficiency may be reduced since impurities to be filtered by the filter dissolve in the IPA. When step S10 is completed, the drying promoting liquid nozzle 703 may be retracted to a home position.

A process condition in step S10 is as follows.
Plate heating switch: OFF
Plate temperature: Not controlled (approximately normal temperature)
Rotation number of wafer: 10 rpm
Chemical liquid nozzle: No ejection
Rinse nozzle: No ejection
IPA nozzle: Ejecting IPA from the position directly above the central portion of the wafer W

[Step S11]

Figure 11K:
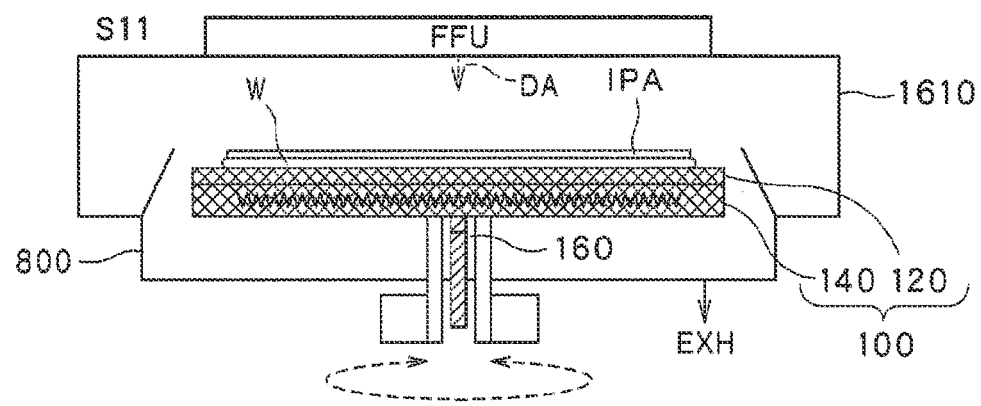
Figure 11L:
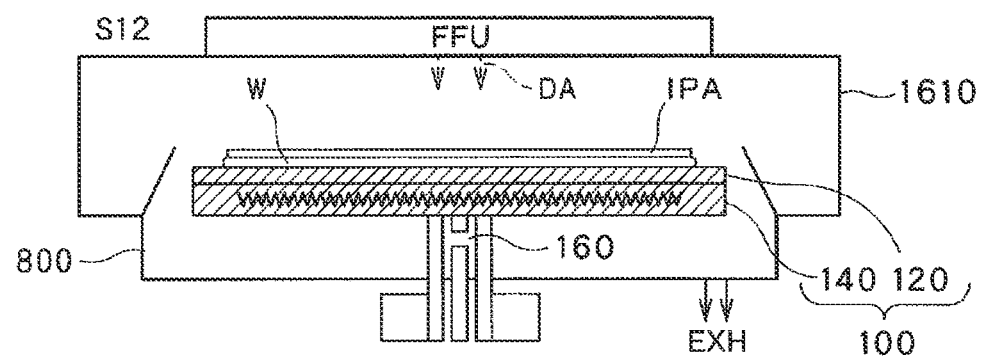

Subsequently, as illustrated in FIG. 11K, the rotation of the wafer W is stopped, and the switch mechanism 160 is turned on so that the hot plate 140 is energized to generate heat. As a result, the temperatures of the suction plate 120, the wafer W suctioned to the suction plate W, and the IPA on the wafer W are raised to, for example, about 60 degrees C. (or a temperature higher than the same). At this time, the rotary table 100 (the suction plate 120 and the wafer W) may perform oscillating rotation, or the rotary table 100 may be stopped. At this time as well, the air supply flow rate into the chamber and the exhaust flow rate from the cup are maintained at low flow rates to suppress evaporation or volatilization of the IPA forming the liquid film. Thus, it is possible to prevent the liquid film from partially disappearing at an undesirable position on the wafer W. By raising the temperature of the IPA, a surface tension of the IPA is reduced, and a pattern collapse suppressing effect is increased in step S13 to be described later. In addition, by raising the temperature of the IPA, substances that can be dissolved in the IPA are dissolved in the IPA. Thus, it is possible to suppress generation of particles.

A process condition in step S11 is as follows.
Plate heating switch: ON
Plate temperature: 60 degrees C.
Rotation number of wafer: 0 rpm (or oscillating rotation)
Chemical liquid nozzle: No ejection
Rinse nozzle: No ejection
IPA nozzle: No ejection

[Step S12]

Subsequently, as illustrated in FIG. 11I, the switch mechanism 160 is turned off. As a result, the temperatures of the suction plate 120 and the wafer W gradually decrease.

A process condition in step S12 is as follows.
Plate heating switch: OFF
Plate temperature: Not controlled (gradually decreasing due to heat dissipation)
Rotation number of wafer: 0 rpm
Chemical liquid nozzle: No ejection
Rinse nozzle: No ejection
IPA nozzle: No ejection

[Step S13]

Figure 11M:
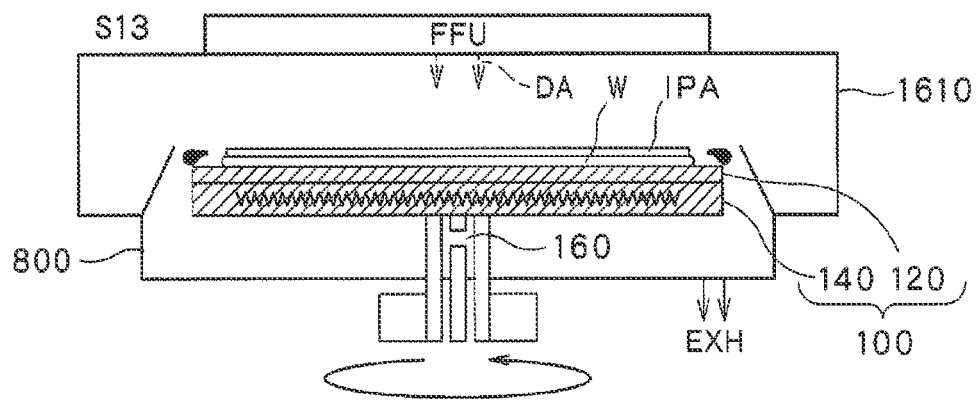

Subsequently, as illustrated in FIG. 11M, the wafer W is rotated at a high speed of about 1,000 to 1,500 rpm so that the IPA is removed from the front surface of the wafer W by centrifugal separation. A process condition in step S13 is as follows.
Plate heating switch: OFF
Plate temperature: Not controlled (gradually decreasing due to heat dissipation)
Rotation number of wafer: 1,000 rpm
Chemical liquid nozzle: No ejection
Rinse nozzle: No ejection
IPA nozzle: No ejection

[Step S14 (Wafer Unloading Step)]

When the wafer W has dried, the rotation of the wafer W is stopped, and the wafer W is taken out from the processing unit 16 by the arm of the substrate transfer device 17.

A process condition in step S14 is as follows.
Plate heating switch: OFF
Plate temperature: Not controlled (gradually decreasing due to heat dissipation)
Rotation number of wafer: 0 rpm
Chemical liquid nozzle: No ejection
Rinse nozzle: No ejection
IPA nozzle: No ejection The details of the wafer unloading step will be described with reference to FIG. 2. First, the switching device (three-way valve) 156 is switched to change a connection destination of the suction pipe 155W from the suction device 157W to the purge gas supply device 159. As a result, the purge gas is supplied to the plate bottom surface suction flow path groove 121P, and to the concave region 125W of the top surface 120A of the suction plate 120 via the substrate bottom surface suction flow path groove 122W. Thus, the suction of the wafer W to the suction plate 120 is released.

With the above operation, the suction of the suction plate 120 to the hot plate 140 is also released. Since it is not necessary to release the suction of the suction plate 120 to the hot plate 140 each time a processing of a single sheet of wafer W is completed, a piping system may be changed such that release of the suction is not performed.

Subsequently, the lift pins 211 are raised to the delivery position. Since the suction of the wafer W to the suction plate 120 is released through the above-described purge process, the wafer W can be easily separated from the suction plate 120. Therefore, it is possible to prevent the wafer W from being scratched.

Figure 11N:
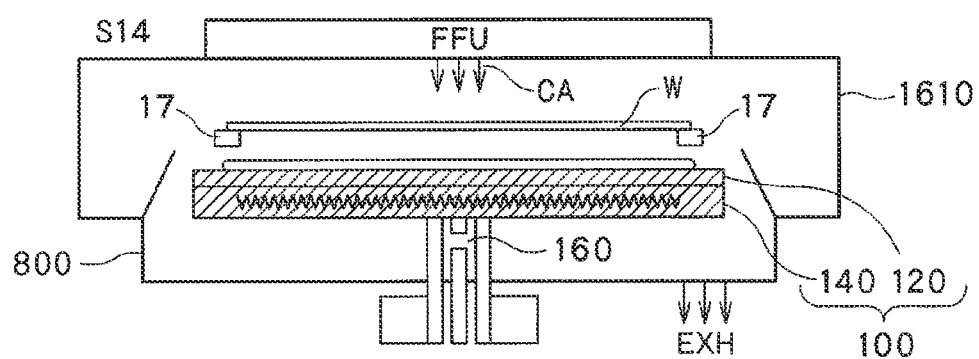

Subsequently the wafer W placed on the lift pins 211 is raised by the arm of the substrate transfer device 17 (see FIGS. 1 and 11N) and unloaded to the outside of the processing unit 16. Thereafter, the wafer sensor 860 confirms whether no wafer W is present on the suction plate 120.

[Step S15]

Figure 11O:
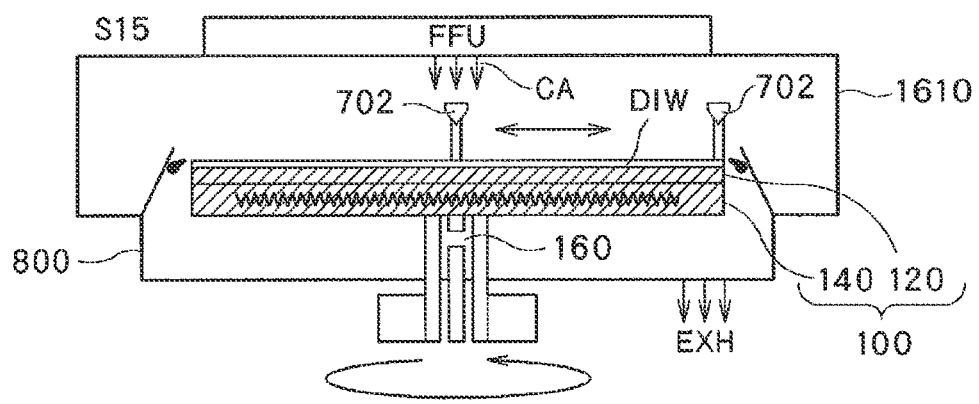
Figure 11P:
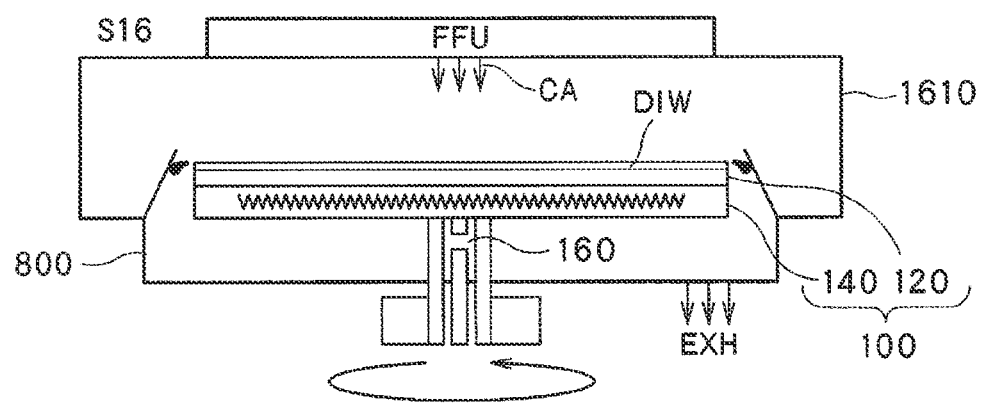

Subsequently, as illustrated in FIG. 11O, the rinse nozzle 702 is moved to a position directly above the central portion of the suction plate 120 of the rotary table 100 while maintaining the air supply flow rate into the chamber and the exhaust flow rate from the cup. The rotary table 100 is rotated at a rotation number of about 1,000 rpm or less. In this state, DIW as a rinsing liquid is supplied from the rinse nozzle 702 to the central portion of the suction plate 120 to clean the front surface of the suction plate 120. By performing this cleaning process, it is possible to prevent a rear surface of a wafer W to be processed subsequently from being contaminated.

In step S15, the suction plate 120 is deprived of heat by the DIW at normal temperature so that the temperature thereof drops to approximately normal temperature. In step S15, the rinse nozzle 702 may reciprocate between the position directly above the center of the suction plate 120 and the position directly above the peripheral edge of the wafer W. As a result, the entire surface of the suction plate 120 can be uniformly cleaned, and the temperature of the suction plate 120 can be uniformly reduced.

A process condition in step S15 is as follows.
Plate heating switch: OFF
Plate temperature: Not controlled (gradually decreasing due to heat dissipation and DIW)
Rotation number of wafer: 1,000 rpm or less
Chemical liquid nozzle: No ejection
Rinse nozzle: Ejection (fixed to the central portion of the wafer W or moving between the central portion and the peripheral edge of the wafer W)
IPA nozzle: No ejection

[Step S16]

Subsequently, as illustrated in FIG. 11P, the ejection of the DIW from the rinse nozzle 702 is stopped, and the rotary table 100 is rotated at a high speed of about 1,000 to 1,500 rpm so that the front surface of the suction plate 120 is dried by centrifugal separation. As a result, operations of one cycle (steps S1 to S16) in the processing unit 16 are completed. When there is a wafer to be processed subsequently, the process returns to step S1.

A process condition in step S16 is as follows.
Plate heating switch: OFF
Plate temperature: Not controlled (normal temperature)
Rotation number of wafer: 1,000 to 1,500 rpm
Chemical liquid nozzle: No ejection
Rinse nozzle: No ejection
IPA nozzle: No ejection Hereinafter, problems that may occur in step S1 (holding step) and step S2 (preheating step) and countermeasures thereto will be described in detail. Step S1 (holding step) includes wafer placing step S1-1 in which the wafer W is placed on the top surface 120A of the suction plate 120 by lowering the lift pins 211 holding the wafer W, and wafer suction step S1-2 in which the wafer W placed on the suction plate 120 is suctioned to the suction plate 120. In the above-described embodiment, in step S1 (holding step), the wafer W at normal temperature is placed on the suction plate 120 at normal temperature and then immediately suctioned to the suction plate 120. Immediately thereafter, step S2 (preheating step) is executed.

The wafer W and the suction plate 120 expand or contract as the temperatures thereof change. When the temperature of the wafer W and/or the temperature of the suction plate 120 change after the wafer W has been suctioned to the suction plate 120, due to a difference in amount of expansion or contraction between the wafer W and the suction plate 120, the wafer W moves to deviate from the suction plate 120 in a state of being in contact with and pressed against the suction plate 120. When an amount of the deviation is large, scratches having a non-negligible depth or height may occur on the rear surface of the wafer W. Such scratches may cause defocus in an exposure process of photolithography. Hereinafter, a method of preventing or suppressing occurrence of scratches on a rear surface of a wafer W will be described.

[First Method: Uniformizing Temperature of Wafer/Suction Plate During Suction]

Prior to describing the first method, a difference in the amount of thermal expansion between the wafer W and the suction plate 120 due to a temperature change will be considered. The parameters used for consideration are defined as follows.

$\alpha p$: Linear expansion coefficient of the suction plate 120
$\alpha w$: Linear expansion coefficient of the wafer W
(here, it is assumed that the linear expansion coefficients $\alpha p$ and $\alpha w$ are those obtained within a temperature range in which the wafer W is exposed in the apparatus according to the above-described embodiment (e.g., about 24 degrees C. to 80 degrees C.))

Tpi: Temperature of the suction plate 120 at the time immediately before the wafer W is suctioned to the suction plate 120 (time point t0)

Twi: Temperature of the wafer W immediately before the wafer W is suctioned to the suction plate 120

Tt: Temperature of the wafer W and the suction plate 120 at the time (time point t2) when a certain amount of time elapses from the moment of suction (time point t1) and the temperatures of the wafer W and the suction plate 120 become almost the same (the temperature of the wafer W and the suction plate 120, for example, in the preheating step or the processing step)

An amount of change in length per unit length of the suction plate 120 ($\Delta Lp$) from time point t1 to time point t2 can be expressed by $\Delta Lp = \alpha p (Tt - Tpi)$. In addition, an amount of change in length per unit length of the wafer W ($\Delta Lw$) from time point t1 to time point t2 can be expressed by $\Delta Lw = \alpha w (Tt - Twi)$. That is, a difference in amount of change in length per unit length of the suction plate 120 and the wafer ($\Delta Lp - \Delta Lw$) can be expressed as follows.

$$\Delta Lp - \Delta Lw = \alpha p (Tt - Tpi) - \alpha w (Tt - Twi) \quad \text{Equation (1)}$$

Examples of characteristics required for the suction plate 120 may include a high thermal conductivity (in order to heat the wafer W efficiently) and a relatively small difference in linear expansion coefficient from that of the wafer W (in order to suppress occurrence of the above-mentioned scratches). Examples of materials having such characteristics may include silicon nitride (SiC) and aluminum nitride (AlN). In addition, when it is necessary to keep a surface resistivity low as a countermeasure against static electricity, it is desirable to form the suction plate 120 using SiC of an electrostatic countermeasure grade.

The linear expansion coefficient of SiC ($\alpha p$) is about $4.5 \times 10^{-6}$/K, and the linear expansion coefficient of silicon S1 ($\alpha w$), which is a material of the wafer W, is about $3.9 \times 10^{-6}$/K. However, linear expansion coefficients of materials have some differences depending on a manufacturer providing the materials. Assuming that the processing temperature of the wafer W is 60 degrees C. the above Equation (1) can be rewritten as follows.

$$\Delta Lp - \Delta Lw = (4.5 \times 10^{-6}/K) \times (60 - Tpi) - (3.9 \times 10^{-6}/K) \times (60 - Twi)$$

Here, when $Tpi = Twi$, $\Delta Lp - \Delta Lw = (4.5 \times 10^{-6}/K - 3.9 \times 10^{-6}/K) \times (60 - Tpi)$. That is, $\Delta Lp - \Delta Lw$ is determined depending on a difference between the temperature at the time of suction and the processing temperature.

When $Tpi = Twi = 24$ degrees C. (normal temperature), $\Delta Lp - \Delta Lw = 0.0000216$, and when the wafer W is a 12-inch wafer (having a radius of 150 mm), the difference in the amount of thermal expansion over the wafer radius is $150$ mm$\times 1000 \times 0.00000216 = 3.24$ µm.

When $Tpi = Twi = 60$ degrees C. (processing temperature). $\Delta Lp - \Delta Lw$ is zero, and the difference in the amount of thermal expansion over the wafer radius is zero.

When Tpi and Twi are not equal, for example, when $Tpi = 60$ degrees C. and $Twi = 24$ degrees C., $\Delta Lp - \Delta Lw = (4.5 \times 10^{-6}/K) \times (60 - 60) - (3.9 \times 10)^{-6}/K) \times (60 - 24) = 0.0001404$, and when the wafer W is a 12-inch wafer, the difference in the amount of thermal expansion over the radius of the wafer W is $150$ mm$\times 1000 \times 0.0001404 = 21.06$ µm.

As is clear from the above trial calculation, it is desirable that the temperature Tpi of the suction plate 120 and the temperature Twi of the wafer W when the wafer W is suctioned to the suction plate 120 be made equal to each other. In addition, Tpi and Twi do not necessarily have to be completely the same, and |Tpi−Twi| may be, for example, 5 degrees C. or lower. In order to reduce the difference in the amount of thermal expansion due to heating, it is more desirable to perform the suction of the wafer W after raising the temperature of the wafer W to a high temperature (e.g., the processing temperature). In this case, it is possible to further prevent or suppress occurrence of scratches on the rear surface of the wafer W due to the difference in the amount of thermal expansion.

In order to perform the suction of the wafer W after raising the temperature of the wafer W to a high temperature (e.g., 60 degrees C.), the following steps V1 to V4 may be executed instead of the above-mentioned step S1 (holding step) and step S2 (preheating step).

Figure 12A:
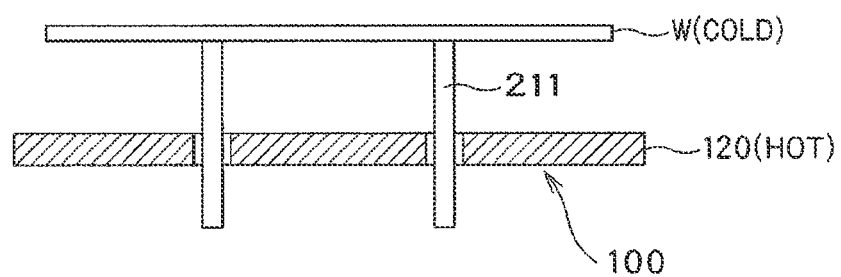
FIGS. 12A to 12D are schematic views illustrating an example of a procedure of suctioning and temperature-raising of a wafer.

Step V1: The suction plate 120 is preheated to 60 degrees C. Since the temperature of the suction plate 120 can be considered as substantially the same as the temperature of the hot plate 140, the temperature of the suction plate 120 can be monitored by the temperature sensor 146 described above (FIG. 12A).

Figure 12B:
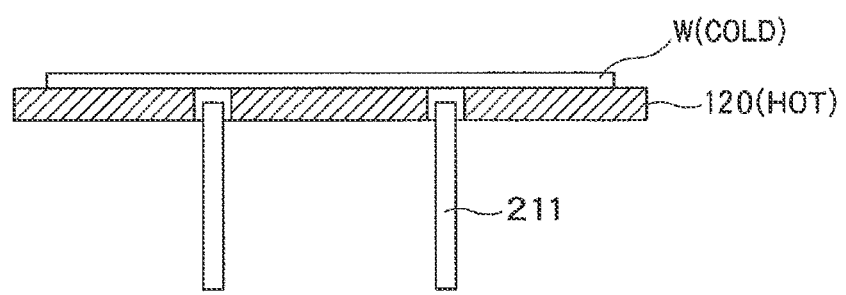

Step V2 (placing step): The wafer W is placed on the front surface of the suction plate 120 (suction is not performed) by lowering the lift pins 211 in a state in which the wafer W is supported by the lift pins 211 that has been raised. Although the wafer W and the suction plate 120 are not in close contact with each other, the wafer W and the suction plate 120 are in contact with each other or are close to each other with a minute gap of about several tens of microns at the maximum. Therefore, the wafer W is heated through direct heat conduction from the suction plate 120, indirect heat conduction via air, heat radiation of the suction plate 120, and the like (FIG. 12B). It was confirmed in an experiment that a temperature rising rate was reduced to ¹⁄₁₀ merely by separating the wafer W from the suction plate 120 by about 0.5 mm by the lift pins 211. That is, it was confirmed that it is desirable to raise the temperature of the wafer W in the state in which the wafer W is placed on the suction plate 120.

Figure 12C:
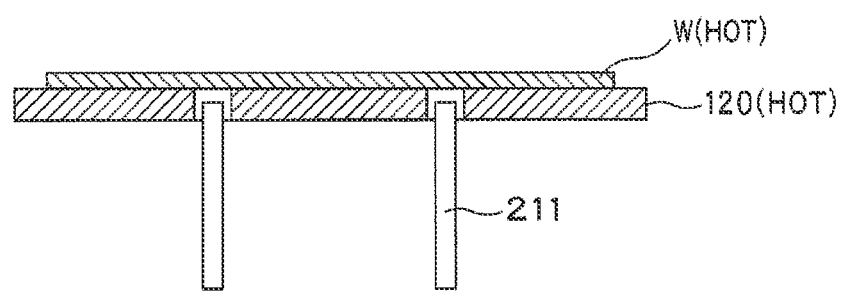

Step V3 (temperature increase and standby step): It is waited until the temperature of the wafer W reaches 60 degrees C. or stabilizes at 60 degrees C. In this case, the temperature of the wafer W is monitored by the above-described infrared thermometer 870 (see FIG. 2) (FIG. 12C).

Figure 12D:
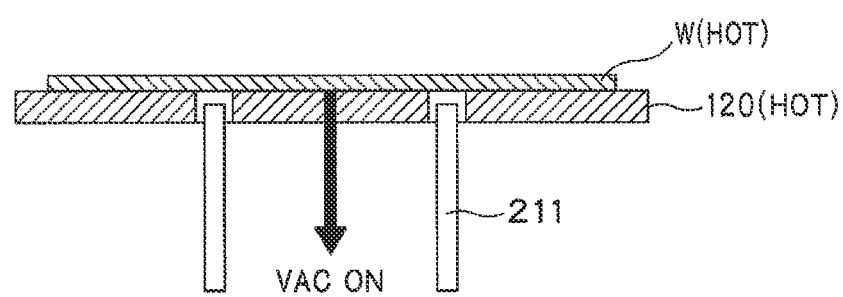

Step V4 (suction step): When the temperature of the wafer W reaches 60 degrees C. or stabilizes at 60 degrees C., the wafer W is suctioned to the suction plate 120. At this time, it may be confirmed whether the suction plate 120 is at 60 degrees C. (FIG. 12D).

When the step V4 is completed, since the suction plate 120 and the wafer W are already at 60 degrees C., it is possible to proceed to step S3 described above.

Strictly speaking, it is desirable that $(4.5 \times 10^{-6}/K) \times (60 - Tpi) = (3.9 \times 10^{-6}/K) \times (60 - Twi)$. Thus, for example, a case of (Tpi, Twi) = (52.2 degrees C., 51.0 degrees C.) or (56.1 degrees C., 55.5 degrees C.) may be considered. However, in this case, since the suction is performed when the temperature is transiently changed, it becomes difficult to execute the above steps S1 to S4 in a state in which the temperature is reliably controlled. In actual operation, it is desirable to perform the suction in a state in which the temperature of the wafer W and the temperature of the suction plate 120 are stabilized at the same temperature (e.g., 80 degrees C.).

For example, in the case in which $Tpi = Twi = 60$ degrees C. when the temperature of the suction plate 120 and the temperature of the wafer W are reduced to normal temperature (e.g., 24 degrees C.) in the state in which the wafer W is suctioned to the suction plate 120 after processing the wafer W, a difference in amount of heat shrinkage over the radius of the wafer W due to heat shrinkage is 3.24 µm as in the trial calculation of $Tpi = Twi = 24$ degrees C. When it is desired to prevent the rear surface of the wafer W from being scratched due to the difference in the amount of heat shrinkage, the suction of the wafer W may be released at a time point at which the temperature of the wafer W is relatively high. At this time, for example, by supplying DIW having a temperature higher than normal temperature and IPA having a temperature higher than normal temperature to the wafer W after the liquid processing, it is possible to make the temperature of the wafer W at the time point at which a series of processes on the wafer W is completed higher than normal temperature.

It is desirable that, although also varying depending on a permissible scratch sizes (a length, a height, and a depth), the difference in the amount of thermal expansion (amount of shrinkage) over the radius of the wafer W due to temperature fluctuation of the wafer W and the suction plate 120 be smaller than, for example, 5 µm. It is desirable to select the material of the suction plate 120 having an appropriate linear expansion coefficient based on a permissible difference in thermal expansion amount (shrinkage amount) and temperature fluctuation ranges of the wafer W and the suction plate 120 (which depend on process conditions). It is desirable that the linear expansion coefficient of the material of the suction plate 120 be as close as possible to the linear expansion coefficient of the wafer W.

Next, experimental results obtained by investigating a relationship between a temperature at the time of suction and scratches on a rear surface of a wafer will be described.

In Example 1, a wafer W at normal temperature (24 degrees C.) was suctioned to the suction plate 120 at normal temperature (24 degrees C.) in step S1 (wafer holding step) in the same manner as in the above-described embodiment, and then the heater 142 was immediately energized to execute step S2 (preheating step). The suction was released after thirty seconds elapsed after suctioning the wafer W to the suction plate 120 (that is, after the preheating step was started).

In Example 2, the above-described steps V1 to V4 were executed in place of the above-described step S1 (wafer holding step) and step S2 (preheating step). The temperature of the suction plate 120 was set to 60 degrees C., and transition from step V3 (temperature increase and standby step) to step V4 (suction step) was performed when the temperature of the wafer W reached 60 degrees C. The suction was released after thirty seconds elapsed after the start of step V4.

In Comparative Example, in the above-described step S1 (wafer holding step), the wafer W at normal temperature (24 degrees C.) was suctioned to the suction plate 120 at 40 degrees C., which is a temperature higher than normal temperature, and then the heater 142 was immediately energized to execute step S2 (preheating step). The suction was released after thirty seconds elapsed after suctioning the wafer W to the suction plate 120 (that is, after the preheating step was started). When an execution time of step S15 described above is short, the temperature of the suction plate 120 may not be completely reduced to normal temperature, and such a case is assumed in this comparative example.

In both Examples 1 and 2 and Comparative Example, a vacuum suction force was set to be the same (−80 kPa), and the wafer W was not rotated or the processing liquid was not supplied to the wafer after the suction.

After the suction was released, scrub cleaning was performed on the rear surface of the wafer W, and then an experiment was conducted to check the number of defects having a size of 100 nm or more by a particle inspection device. Most of the detected defects were scratches (unevenness) because real particles could be substantially removed through the scrub cleaning. Hereinafter, for the sake of simplicity, the above experiment will be referred to as a "scratch formation experiment," and the number of defects having a size of 100 nm or more detected after the scrub cleaning in the "scratch formation experiment" will be referred to as a "number of scratches".

In Comparative Example, the numbers of scratches were 16,305, 16,771, and 15,866. In contrast, in Example 1, the numbers of scratches were 3,476, 3,748, and 3,717, and in Example 2, the numbers of scratches were 3,218, 3,951, and 3,702. That is, in Examples 1 and 2, the numbers of scratches were significantly reduced compared with Comparative Example. In addition, when the rear surfaces of the wafers W were observed by a scanning electron microscope (SEM), there were both streaky scratches (scratch marks) and punctiform scratches in Comparative Example, but in Examples 1 and 2, most of the scratches were punctiform scratches. From this, it can be confirmed that occurrence of scratches due to the difference in the amount of thermal expansion can be significantly suppressed by performing the suction at the same temperature.

As reference data, after performing only steps V1 and V2 described above, scrub cleaning was performed on the rear surfaces of wafers W, and then an amount of foreign substances of 100 nm or more was detected by a particle inspection device. As a result, the amount of foreign substances were 325, 359, and 339. From this, it can be confirmed that the number of scratches caused by only placing the wafers W at normal temperature (24 degrees C.) on the suction plate 120 at 60 degrees C. without suction were small, and that most of the scratches caused in Example 2 occurred after the suction.

There is no significant difference in the number of generated scratches between Example 1 and Example 2. However, when performing the procedure of Example 1, it is necessary to reduce the temperature of the suction plate 120, which has risen to 60 degrees C. or higher in step S11, to normal temperature at the start of step S1. This requires a relatively long time. For example, step S15 needs to be performed for a relatively long time. In addition, when only the cleanliness of the suction plate 120 is considered, it is not necessary to perform step S15 (cleaning of the suction plate 120) every time a processing of a single sheet of wafer W is completed. However, when a cooling of the suction plate 120 is essential, it is necessary to perform step S15 every time a processing of a single sheet of wafer W is completed. This causes lowering in throughput per a single processing unit.

In contrast, when the procedure of Example 1 is executed, the temperature control of the suction plate 120 can be started immediately after the wafer W, which has been processed immediately before, is unloaded. In addition, when step S15 is performed using, for example, hot DIW of about 60 degrees C., it is possible to prevent the temperature of the suction plate 120 from dropping. Thus, after the end of step S15, almost no time is required to raise the temperature of the suction plate 120 to about 60 degrees C. It can be said that the same is applicable even when step S15 is not performed because the temperature of the suction plate 120 at the end of step S14 is relatively high.

As an example, when the temperature of the suction plate 120 at the end of step S14 was 35 degrees C. a required time per cycle of the processing was 301 seconds in Example 2 and 361 seconds in Example 1. In Example 1, it took about seventy seconds to cool the suction plate 120 to normal temperature (24 degrees C.). Instead, in Example 2, since the suction was performed after the temperature of suction plate 120 was increased to 60 degrees C. and then the temperature of the wafer W was increased to 60 degrees C., the temperature raising (heating) efficiency of the wafer W was low. Therefore, in Example 2, an extra time of about ten seconds was required for temperature raising compared with Example 1.

Therefore, when the above-mentioned steps S1 to S15 are executed for each wafer W, Example 2 having a higher throughput is more desirable than Example 1. However, depending on a series of steps performed on a single sheet of wafer W, the temperature immediately before unloading the wafer W from the rotary table 100 may have already been reduced to a temperature near normal temperature. In this case, it may be desirable to adopt Example 1.

[Second Method: Reducing Contact Area Between Suction Plate and Wafer W]

In the second method, a suction plate 120' according to a modified example is used. Instead of the surface structure of the suction plate 120 illustrated in FIGS. 6 and 9, a surface structure provided with a plurality of micro-support members 123 disposed on a front surface of the suction plate 120 at intervals as illustrated in FIG. 13 is used in the suction plate 120'.

A configuration of a peripheral edge region of the suction plate 120' may be the same as the configuration of the peripheral edge region (a region $I_{OUT}$ in FIG. 9) of the suction plate 120 illustrated in FIG. 9. Unlike the central region (a circular region. $I_{IN}$ in FIG. 9) of the suction plate 120 illustrated in FIG. 9, a circular central region of the suction plate 120' has a configuration having the plurality of micro-support members 123 (only three micro-support members are illustrated in FIG. 13) protruding from a flat surface, as schematically illustrated in FIG. 13. The circular central region of the suction plate 120' has a diameter slightly smaller than the diameter of the wafer W.

Figure 13:
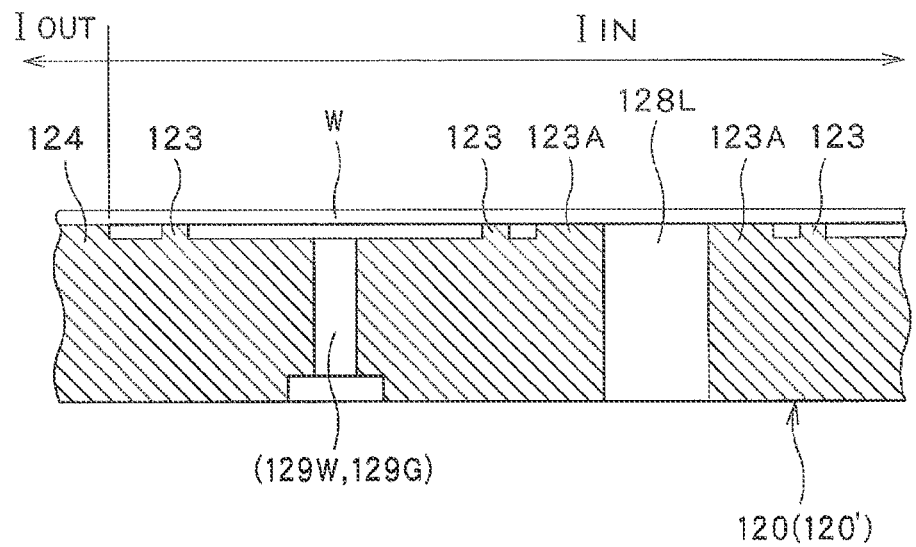
FIG. 13 is a schematic view illustrating another embodiment of the suction plate.

As schematically illustrated in FIG. 13, through-holes similar to the suction through-holes 129W and the purge gas supply through-holes 129G, which are described above with reference to FIGS. 6 and 9, are opened in the central circular region in which the micro-support members 123 of the suction plate 120' are disposed. In addition, a circumference of the lift pin hole 128L penetrating the suction plate 120' is surrounded by a cylindrical wall 123A having the same height as the micro-support members 123. As a result, the suction force acting through the suction through-holes 129 does not leak through the lift pin holes 128L.

In an embodiment, each of the micro-support members 123 has a flat columnar shape with a bottom surface (a top surface) having a diameter of 500 μm and a height of 50 μm, and a distance between two micro-support members 123 is 6 mm. One suction plate 120' has 1,520 micro-support members 123 evenly distributed in the circular central region thereof. The diameter of the top surfaces of the micro-support members 123 may be any size of 1 mm or less.

The size and distance of the micro-support members 123 are not limited to those described above, but it is desirable to be set to satisfy the following conditions.

(Condition 1) When a wafer W is suctioned to the suction plate 120', a gap should be reliably present between the rear surface of the wafer W and the top surface of the suction plate 120' over the entire region except the region in which the micro-support members 123 are present.

(Condition 2) A total contact area between the bottom surface of the wafer W and the top surfaces of the micro-support members 123 should be as small as possible.

Hereinafter, the configuration of the suction plate 120' will also be referred to as Configuration Example 1.

Figure 14:
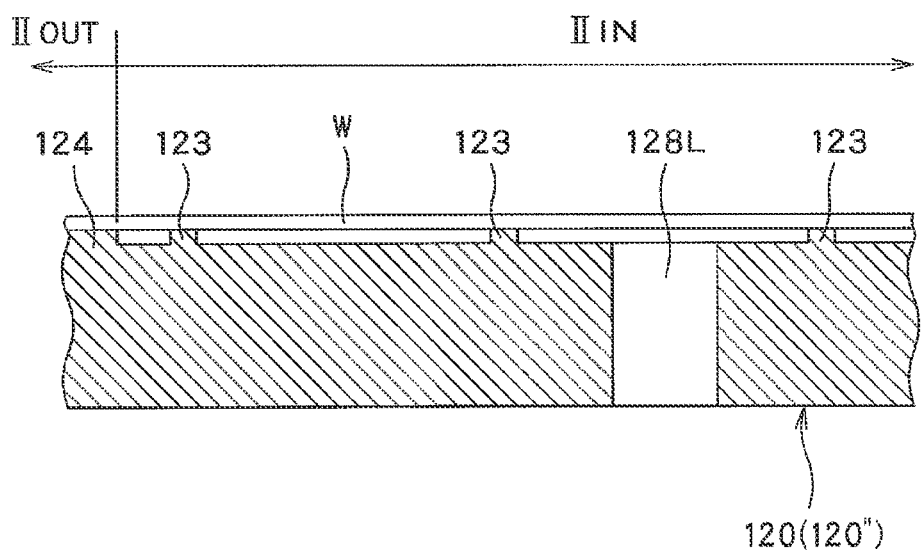
FIG. 14 is a schematic view illustrating still another embodiment of the suction plate.

When warp of the wafer W is small sand the wafer W is sufficiently flat, a suction plate 120" according to another modified embodiment illustrated in FIG. 14 may be used. The suction plate 120" is configured to suction only the peripheral edge region of the wafer W and simply support a region inward of the peripheral edge region by the micro-support members 123. Specifically, a configuration of the peripheral edge region of the suction plate 120" may be the same as the configuration of the peripheral edge region (the region $II_{OUT}$ in FIG. 9) of the suction plate 120 illustrated in FIG. 9. As in the suction plate 120', a circular central region (corresponding to the region $II_{IN}$ in FIG. 9) of the suction plate 120" has a configuration including the plurality of micro-support members 123 (only three micro-support members are illustrated in FIG. 13) protruding from a flat surface as schematically illustrated in FIG. 13. The circular central region of the suction plate 120" has a diameter slightly smaller than the diameter of the wafer W.

The suction plate 120" suctions only the peripheral edge region of the wafer W by suctioning an annular region of the partition wall 124 closest to the through-hole 129G and an annular region of the partition wall 124 second closest to the through-hole 129G. Since the circular central region of the suction plate 120" is not suctioned, it is not necessary to provide through-holes corresponding to the suction through-holes 129W and the purge gas supply through-holes 129G. In addition, it is not necessary to provide the cylindrical wall 123A around the lift pin hole 128L as illustrated in FIG. 13. In the suction plate 120", since almost no load is applied to the micro-support members 123, the number of micro-support members 123 may be small. The number of micro-support members 123 may be, for example, about fifteen.

Hereinafter, the configuration of the suction plate 120" will also be referred to as Configuration Example 2. In addition, the configuration of the suction plate 120 illustrated in FIGS. 6 and 9 will also be referred to as Configuration Example 3.

The above-mentioned scratch formation experiment was performed on each of Configuration Examples 1 to 3 under the same condition (the same condition as in Example 1 described above), and the numbers of scratches formed on the rear surface of the wafer W were investigated. In Configuration Example 1, the number of scratches was 3,478. In Configuration Example 2, the number of scratches was 937. In Configuration Example 3, the number of scratches was 5,071. From this experiment, it was confirmed that the number of scratches can be reduced by reducing the contact area between the suction plate 120 and the wafer W.

Total surface areas of the suction plates 120 to which the suction force is applied have the following relationship: Configuration Example 3>Configuration Example 1>Configuration Example 2. For example, when comparing Configuration Example 1 and Configuration Example 3, contact surface pressures at the time of the suction have the following relationship: Configuration Example 1>>Configuration Example 3. Therefore, it may be considered that the rear surface of the wafer W is more easily scratched in Configuration Example 1 than in Configuration Example 3. However, in the experimental results, the number of scratches in Configuration Example 1 was smaller than that in Configuration Example 3.

The inventor thinks the reason why the number of scratches is small in Configuration Example 1 is as follows. The scratches on the rear surface of the wafer W are caused by a relative movement of the suction plate 120 and the wafer W in a state in which the micro-protrusions formed on the front surface of the suction plate 120 bite into the rear surface of the wafer W. When the total contact area between the rear surface of the wafer W and the top surfaces of the columnar bodies is reduced, a probability that micro-protrusions having a problematic size are present is reduced. Thus, a probability that scratches having a problematic size occur is also reduced.

The plurality of micro-support members 123 may be formed by performing a blast process on a flat surface to which a hard mask is applied. By scrapping regions around the masked portions by a blasting material, the micro support members 123 remains below the masked portions.

By sufficiently smoothing the front surface of the suction plate before applying the hard mask through polishing or lapping (e.g., Ra<about 0.01), the probability that micro-protrusions are present on the top surfaces of the micro-support members 123 may be significantly reduced, and even when the micro-protrusions are present, the height thereof may be reduced. Thus, it is possible to prevent or suppress occurrence of scratches on the rear surface of the wafer W. After performing the blast process and removing the hard mask, the top surfaces of the micro-support members 123 may be polished or lapped. Hard particles remaining on the front surface may be removed through ultrasonic cleaning after the polishing or lapping.

It is also desirable to perform R-chamfering on peripheral edges of the top surfaces of the micro-support members 123 through polishing (brush polishing or lap polishing) or the like. In this case, it is possible to prevent or suppress occurrence of scratches on the rear surface of the wafer W, which may be caused by the biting of the peripheral edges of the top surfaces into the rear surface of the wafer W. When prismatic micro-protrusions are used instead of the columnar micro-support members 123, corner portions of the top surfaces thereof may bite into the rear surface of the wafer W. Therefore, it is desirable to use such columnar micro-protrusions. In Configuration Example 3 as well, it is desirable to polish wafer contact surfaces of the suction plate 120 and corner portions thereof.

[Third Method: Using Low-Aggressive Material]

A material obtained by coating a surface of SiC (a wafer support surface) with a soft material (e.g., a resin material) may be used as the material of the suction plate 120. As the resin material, for example, polyetheretherketone (PEEK) containing a carbon filler may be used. By using such a resin material, there is no possibility that the rear surface of a wafer W is scratched by the above-described mechanism. In addition, by using a conductive filler having low aggressiveness against a wafer, such as carbon, it is possible to prevent the wafer W from being charged. Since a thermal conductivity of the resin material, such as PEEK, is low, it is desirable to have the coating thickness be thin (e.g., about 0.5 mm). It is also possible to use an ethylene tetrafluoride-perfluoroalkoxy ethylene copolymer (PFA) as the resin material for coating.

As a result of performing the scratch formation experiment described above using a suction plate coated with PEEK containing a carbon filler on the surface of SiC (the experiment condition is the same as that of Example 1 described above except that the vacuum suction force was slightly lowered to −60 kPa), occurrence of scratches was not observed on the rear surface of the wafer. Although adhesion of carbon-based foreign substances was observed on almost the entire rear surface of the wafer, it was possible to remove the foreign substances through scrub cleaning. The use of a carbon filler-containing PEEK coating is very beneficial in a case where occurrence of scratches on the rear surface of the wafer W is not permissible at all. In this case as well, it is beneficial to jointly use the above-mentioned first method. This is because it is possible to prevent carbon from falling off from the coating and to prevent the coating from being worn due to the relative sliding between the rear surface of the wafer W and the coating surface (due to the difference in the amount of thermal expansion).

The surface of SiC (wafer support surface) coated with diamond-like carbon (DLC) having a frictional coefficient lower than that of SiC itself may be used as the material of the suction plate 120.

The surface of SiC (wafer support surface) may be smoothed by forming a SiC layer through CVD on the surface of SiC or by performing a recrystallization annealing process on the SiC. When a sintering aid disappears in a SiC firing step to expose voids on the surface of the SiC, SiC particles fall off in a vicinity of the voids, which may cause scratches on the rear surface of the wafer W. Through the above-mentioned smoothing process, it is possible to prevent occurrence of such an event.

[Fourth Method: Cleaning Front Surface of Suction Plate (Cleaning)]

As in step S15 described above, the front surface of the suction plate 120 may be cleaned every time a process for a single sheet of wafer W is completed, or periodically. The cleaning process may be performed through, for example, scrub cleaning using a brush by, for example, spraying a gas (e.g., $N_2$ gas) from a gas nozzle to the front surface of the suction plate 120, and/or ejecting a cleaning chemical liquid (e.g., DHF or SC1), a rinsing liquid (e.g., DIW), or two fluids (e.g., a mixed fluid of DIW mists and $N_2$ gas) from the cleaning liquid nozzle to the front surface of the suction plate 120. It is desirable to perform the cleaning process in a state in which a purge gas is ejected from suction gas suction holes and purge gas supply holes. In this case, it is possible to prevent the liquid from penetrating into the holes. By performing the cleaning process periodically as described above, it is possible to prevent hard particles that have fallen off from, for example, the front surface of the suction plate 120 from biting into the rear surface of the wafer W. Therefore, it is possible to prevent occurrence of scratches on the rear surface of the wafer.

[Other Methods]

By reducing the vertical movement speed of the lift pins 211, for example, about 2 mm/sec, it is possible to prevent or suppress occurrence of scratches on the rear surface of the wafer W when the wafer W lands on the suction plate 120 or when the wafer W separates from the suction plate 120.

The above-described various methods (the methods for preventing or suppressing occurrence of scratches on the rear surface of the wafer W) can be used in appropriate combination while considering a permissible scratch level.

It should be understood that the embodiments disclosed herein are exemplary in all respects and are not restrictive. The above-described embodiments may be omitted, replaced, or modified in various forms without departing from the scope and spirit of the appended claims.

The substrate to be processed is not limited to a semiconductor wafer, and may be any kind of substrate used for manufacturing a semiconductor device, such as a glass substrate and a ceramic substrate.

According to the present disclosure, when a substrate processing is performed by suctioning a substrate to a substrate table heated by a heater, it is possible to reduce scratches which may be generated on a rear surface of the substrate during suctioning the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method of performing liquid processing on a substrate in a substrate processing apparatus including a substrate table configured to suction the substrate, a heater configured to heat the substrate table, and a processing liquid nozzle configured to supply a processing liquid to the substrate suctioned to the substrate table, the substrate processing method comprising:

a heating process of heating the substrate table to a predetermined temperature while the substrate is elevated from the substrate table by a lift pin;

after the heating process, a placement process of lowering the lift pin below a top surface of the substrate table and placing the substrate on the top surface of the substrate table heated to the predetermined temperature so as to cause a direct heat conduction between the substrate and the substrate table such that the substrate is heated by the substrate table, without suctioning the substrate;

after the placement process, measuring a temperature of the substrate and performing a suctioning process of suctioning the substrate by the substrate table when there is no temperature difference between the substrate and the substrate table or when a temperature difference between the substrate and the substrate table is within a predetermined range;

after the suctioning process, a processing liquid supply process of supplying the processing liquid having the predetermined temperature from the processing liquid nozzle to the substrate while the substrate is positioned on the substrate table;

after the processing liquid supply process, a wafer unloading process of releasing the suction of the substrate and taking out the substrate from the substrate table by raising the lift pin; and after the wafer unloading process, a cleaning process of cleaning a suction surface of the substrate table by ejecting a cleaning liquid having the predetermined temperature from a cleaning nozzle to the suction surface.

2. The substrate processing method of claim 1, further comprising:

before the suctioning process, a temperature measurement process of measuring the temperature of the substrate by a substrate temperature sensor and measuring the temperature of the substrate table; and a determination process of determining whether there is no temperature difference between the substrate and the substrate table or whether the temperature difference between the substrate and the substrate table is within the predetermined range based on the temperature of the substrate and the temperature of the substrate table, which have been measured in the temperature measurement process, wherein the suctioning process is performed after determining, in the determination process, that there is no temperature difference between the substrate and the substrate table or that the temperature difference between the substrate and the substrate table is within the predetermined range.

3. The substrate processing method of claim 2, further comprising:

subsequent to the placement process, a temperature increase and standby process of waiting for the temperature of the substrate heated by the substrate table to increase until the temperature difference between the substrate and the substrate table is zero or falls within the predetermined range, wherein the suctioning process is performed after the temperature difference between the substrate and the substrate table is zero or falls within the predetermined range by the temperature increase and standby process.

4. The substrate processing method of claim 2, wherein, when the temperature difference between the substrate and the substrate table is within the predetermined range, the temperature difference between the substrate and the substrate table is 5 degrees C. or less.

5. The substrate processing method of claim 2, wherein the cleaning process is performed each time processing of one substrate is completed or periodically.

6. The substrate processing method of claim 1, further comprising:

subsequent to the placement process, a temperature increase and standby process of waiting for the temperature of the substrate heated by the substrate table to increase until the temperature difference between the substrate and the substrate table is zero or falls within the predetermined range, wherein the suctioning process is performed after the temperature difference between the substrate and the substrate table is zero or falls within the predetermined range by the temperature increase and standby process.

7. The substrate processing method of claim 1, wherein the temperature of the substrate is 60 degrees C. when the suctioning process is initiated.

8. The substrate processing method of claim 1, wherein, when the temperature difference between the substrate and the substrate table is within the predetermined range, the temperature difference between the substrate and the substrate table is 5 degrees C. or less.

9. The substrate processing method of claim 1, wherein the cleaning process is performed each time processing of one substrate is completed or periodically.

* * * * *